(12) United States Patent
Daubenspeck et al.

(10) Patent No.: US 8,937,009 B2
(45) Date of Patent: Jan. 20, 2015

(54) FAR BACK END OF THE LINE METALLIZATION METHOD AND STRUCTURES

(71) Applicant: International Business Machines Corporation, Armonk, NY (US)

(72) Inventors: Timothy H. Daubenspeck, Colchester, VT (US); Jeffrey P. Gambino, Westford, VT (US); Karen P. McLaughlin, Poughkeepsie, NY (US); Ekta Misra, Fishkill, NY (US); Christopher D. Muzzy, Burlington, VT (US); Eric D. Perfecto, Poughkeepsie, NY (US); Wolfgang Sauter, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/870,026

(22) Filed: Apr. 25, 2013

(65) Prior Publication Data
US 2014/0319522 A1  Oct. 30, 2014

(51) Int. Cl.
*H01L 21/768* (2006.01)
*H01L 21/44* (2006.01)
*H01L 23/498* (2006.01)
*H01L 23/00* (2006.01)

(52) U.S. Cl.
CPC .............. *H01L 24/11* (2013.01); *H01L 24/13* (2013.01)
USPC ............. 438/613; 438/18; 438/617; 438/618; 438/648; 438/672; 257/48; 257/620; 257/737; 257/738; 257/758; 257/769; 257/E21.508; 257/E21.575; 257/E23.011; 257/E23.069; 257/E23.161

(58) Field of Classification Search
USPC ................... 438/18, 613, 617, 618, 648, 672; 257/48, 620, 758, 769, 737, 738, 257/E21.508, E21.575, E23.011, E23.069, 257/E23.161
See application file for complete search history.

(56) References Cited

U.S. PATENT DOCUMENTS

| 5,530,280 A | 6/1996 | White |
| 6,022,791 A | 2/2000 | Cook et al. |

(Continued)

OTHER PUBLICATIONS

IBM, "Novel BLM Final Via Structure for C4 Crackstop, Crack Sensor, and Wiring," IP.com No. IPCOM000183894D, Jun. 4, 2009, pp. 1-4.

*Primary Examiner* — Dao H Nguyen
(74) *Attorney, Agent, or Firm* — Gibb & Riley, LLC; David A. Cain, Esq.

(57) ABSTRACT

Disclosed are a method for metallization during semiconductor wafer processing and the resulting structures. In this method, a passivation layer is patterned with first openings aligned above and extending vertically to metal structures below. A mask layer is formed and patterned with second openings aligned above the first openings, thereby forming two-tier openings extending vertically through the mask layer and passivation layer to the metal structures below. An electrodeposition process forms, in the two-tier openings, both under-bump pad(s) and additional metal feature(s), which are different from the under-bump pad(s) (e.g., a wirebond pad; a final vertical section of a crackstop structure; and/or a probe pad). Each under-bump pad and additional metal feature initially comprises copper with metal cap layers thereon. The mask layer is removed, an additional mask layer is formed and patterned with third opening(s) exposing only the under-bump pad(s) and solder material is deposited on the under-bump pad(s).

18 Claims, 22 Drawing Sheets

(56) References Cited

U.S. PATENT DOCUMENTS

| | | |
|---|---|---|
| 6,261,945 B1 | 7/2001 | Nye, III et al. |
| 6,734,567 B2 | 5/2004 | Chiu et al. |
| 6,951,801 B2 | 10/2005 | Pozder et al. |
| 7,098,676 B2 | 8/2006 | Landers et al. |
| 7,335,577 B2 | 2/2008 | Daubenspeck et al. |
| 7,470,985 B2 | 12/2008 | Farooq et al. |
| 7,479,447 B2 | 1/2009 | Daubenspeck et al. |
| 7,482,675 B2 | 1/2009 | Adkisson et al. |
| 7,534,651 B2 | 5/2009 | Narayan et al. |
| 7,572,738 B2 | 8/2009 | Nogami |
| 7,687,915 B2 | 3/2010 | Lee et al. |
| 7,897,433 B2 | 3/2011 | Su et al. |
| 8,022,509 B2 | 9/2011 | Jao |
| 8,076,756 B2 | 12/2011 | Lane et al. |
| 8,218,218 B2 | 7/2012 | Tauscher et al. |
| 8,227,918 B2 | 7/2012 | Lu et al. |
| 8,232,651 B2 | 7/2012 | Adkisson et al. |
| 8,242,012 B2 | 8/2012 | Daubenspeck et al. |
| 8,735,276 B2 * | 5/2014 | Chung et al. .................. 438/613 |
| 2003/0162380 A1 * | 8/2003 | Tong et al. .................... 438/613 |
| 2004/0137724 A1 * | 7/2004 | Joshi et al. .................... 438/672 |
| 2004/0150105 A1 | 8/2004 | Yunus et al. |
| 2006/0246403 A1 | 11/2006 | Monpouet et al. |
| 2007/0007659 A1 | 1/2007 | Narayan et al. |
| 2007/0102792 A1 | 5/2007 | Wu |
| 2007/0166992 A1 * | 7/2007 | Daubenspeck et al. ....... 438/613 |
| 2009/0302427 A1 | 12/2009 | Su et al. |
| 2009/0305465 A1 | 12/2009 | Knickerbocker |
| 2010/0200960 A1 | 8/2010 | Angyal et al. |
| 2011/0215476 A1 * | 9/2011 | Lee et al. ...................... 257/762 |
| 2011/0227186 A1 | 9/2011 | Chang et al. |
| 2013/0009307 A1 * | 1/2013 | Lu et al. ........................ 257/738 |

\* cited by examiner

FAR BACK END OF THE LINE METALLIZATION METHOD AND STRUCTURES

BACKGROUND

Methods and structures disclosed herein relate to far back end of the line (FBEOL) metallization during integrated circuit chip manufacturing.

Recently, in an attempt to save on costs, aluminum has been replaced with copper in far back end of line (FBEOL) metallization during integrated circuit chip manufacturing. Specifically, copper has been used instead of aluminum during FBEOL metallization to form metal pads for solder bumps used in controlled collapsed chip connections (C4 connections) (referred to herein as under-bump pads or to herein as solder bump pads) and to simultaneously form additional metal features, such as metal pads for providing electrical access to on-chip devices (e.g., for providing electrical connections between on-chip devices and a printed circuit board (PCB)) (referred to herein as wirebond pads), metal pads for providing electrical access to kerf region (i.e., scribe line) test structures (referred to herein as probe pads), and final (i.e., uppermost) vertical sections of crackstop structures, which extend vertically from the final metallization layer down to the active device layer and border the chips in order to inhibit damage during wafer dicing and chip packaging. Unfortunately, current FBEOL metallization techniques for forming both under-bump pads and additional metal features using copper are not optimal because the surface and bulk copper of the additional metal features is left exposed during subsequent wafer finishing processes (e.g., C4 connection formation processes), thereby leaving such additional metal features at risk of processing-related defects (e.g., etch back, oxidation, etc.), which could impact their final integrity, if development and manufacturing-level optimization activity does not fully succeed.

SUMMARY

In view of the foregoing, disclosed herein is an improved method for far back end of the line (FBEOL) metallization during semiconductor wafer processing. Specifically, after front end of the line (FEOL), middle of the line (MOL) and initial back end of the line (BEOL) processing of a semiconductor wafer, a passivation layer can be formed and patterned with first openings aligned above and extending vertically to metal structures below (e.g., to metal interconnects or main sections of crackstop structures below). A mask layer can be formed on the passivation layer and patterned with second openings aligned above the first openings, thereby forming two-tier openings extending vertically through the mask layer and passivation layer to the structures below. A first electrodeposition process can be performed in order to form, in the two-tier openings, both under-bump pad(s) and additional metal feature(s), which are different from the under-bump pad(s) (e.g., a wirebond pad, a final vertical section of a crackstop structure, and/or a probe pad). Each under-bump pad and additional metal feature can initially be formed so as to comprise copper with metal cap layers thereon. The mask layer can then be removed and an additional mask layer can be formed and patterned with third opening(s) exposing only the under-bump pad(s). Then, a second electrodeposition process can be performed in order to deposit solder material on the under-bump pad(s). During subsequent semiconductor wafer and integrated circuit chip processing, the metal cap layers can protect the additional metal feature(s) from etchback, oxidation, etc. Also disclosed herein are semiconductor structures (e.g., a semiconductor wafer structure and an integrated circuit chip structure), which can be formed using the above-described method.

More particularly, disclosed herein is an improved method for far back end of the line (FBEOL) metallization during semiconductor wafer processing for fabrication of integrated circuit chips.

Specifically, prior to performing the disclosed FBEOL metallization method, conventional front end of the line (FEOL) and middle of the line (MOL) processing can be performed in order to form, on a semiconductor layer of a semiconductor wafer, both active regions for integrated circuit chips and kerf regions adjacent to the active regions. The active regions can comprise devices and the adjacent kerf regions can comprise test structures for performing wafer-level testing of the integrated circuit chips. Next, initial back end of the line (BEOL) processing can be performed in order to form a stack of interlayer dielectrics above the semiconductor layer as well as metal structures within the stack of interlayer dielectrics. For example, metal interconnects can be formed that extend from devices in an active region of the semiconductor layer to the top surface of the stack of interlayer dielectrics above. Similarly, at least one additional metal interconnect can be formed that extends from a test structure in a kerf region to the top surface of the stack of interlayer dielectrics above. Additionally, at least one main section of a crackstop structure can be formed, which extends essentially vertically from the semiconductor layer to the top surface of the stack of interlayer dielectrics and which laterally surrounds a given active region.

FBEOL processing can begin with the formation of a passivation layer above the top surface of the stack of interlayer dielectrics. First openings can be formed in the passivation layer. These first openings can extend vertically through the passivation layer and can be aligned above metal structures (e.g., metal interconnects and/or main sections of crackstop structures) at the top surface of the stack of interlayer dielectrics. After the first openings are formed, a mask layer can be formed above the passivation layer and second openings can be formed in the mask layer. These second openings can extend vertically through the mask layer and can be aligned above the first openings, thereby forming two-tier openings extending vertically through the mask layer and the passivation layer and aligned above the metal structures below. Optionally, the second openings in the mask layer can be wider than the first openings in the passivation layer below.

Next, metal layers can be formed in the two-tier openings so as to essentially simultaneously form: an under-bump pad(s) in first two-tier opening(s) and additional metal feature(s), which are different from the under-bump pad(s), in second two-tier opening(s).

Specifically, each first two-tier opening can be aligned above a metal interconnect, which is at the top surface of stack of interlayer dielectrics and electrically connected to a device in an active region of the semiconductor layer. The metal layers can be deposited such that, in each first two-tier opening, an under-bump pad is formed that comprises a first copper layer and two first metal cap layers stacked on the first copper layer. The first copper layer can have a first lower portion extending vertically through the passivation layer so that it is electrically connected to the metal interconnect and a first upper portion above the first lower portion. The two first metal cap layers can comprise, for example, a first nickel cap layer and a first copper cap layer on the first nickel cap layer.

The additional metal feature(s) referred to above can comprise, for example, a wirebond pad to provide electrical access to another device in an active region of the semiconductor layer, a final vertical section of crackstop structure, or a probe pad to provide electrical access to a test structure within a kerf region of the semiconductor layer. Thus, the alignment of the second two-tier opening(s) for the additional metal feature(s) will depend upon the type of additional metal feature(s) being formed. For example, for a wirebond pad, a second two-tier opening can be aligned above another metal interconnect, which is at the top surface of stack of interlayer dielectrics and electrically connected to another device in the active region of the semiconductor layer. For a final vertical section of a crackstop structure, a second two-tier opening can be aligned above a previously formed main section of a crackstop structure. For a probe pad, a second two-tier opening can be aligned above an additional metal interconnect, which is at the top surface of the stack of interlayer dielectrics and electrically connected to a test structure in a kerf region of the semiconductor layer. In any case, the metal layers can be deposited such that each additional metal feature formed in each second two-tier opening comprises a second copper layer and two second metal cap layers on the second copper layer. The second copper layer can have a second lower portion that extends vertically through the passivation layer and a second upper portion above the second lower portion. The two second metal cap layers can comprise, for example, a second nickel cap layer and a second copper cap layer on the second nickel cap layer.

It should be noted that if the second openings in the mask layer are wider than the first openings in the passivation layer below, as mentioned above, then the first upper portion of the first copper layer of each under-bump pad will be wider than the first lower portion (i.e., the first copper layer of each under-bump pad will be essentially T-shaped) and, similarly, the second upper portion of the second copper layer of each additional metal feature will be wider than the second lower portion (i.e., the second copper layer of each additional metal feature will also be essentially T-shaped).

After the metal layers are deposited, the mask layer can be removed and an additional mask layer can be formed on the passivation layer such that the under-bump pad(s) and additional metal feature(s) are all covered. Then, third opening(s) can be formed in this additional mask layer such that each third opening is aligned above and exposes an under-bump pad only (i.e., such that the additional metal feature(s) remain covered). Next, solder material can be deposited in the third opening(s) and, specifically, onto the exposed under-bump pad(s).

Following solder material deposition, the additional mask layer can be removed and a solder reflow process can be performed to complete formation of the solder bump(s) on the under-bump pad(s). Then, the semiconductor wafer can be diced through the kerf regions to form discrete integrated circuit chips.

Also disclosed herein are semiconductor structures, which can be formed using the above-described method. Specifically, disclosed herein are a semiconductor wafer structure following far back end of the line (FBEOL) metallization, as described above, and an integrated circuit chip structure formed as a result of dicing such a semiconductor wafer structure.

More particularly, the semiconductor wafer structure can comprise a semiconductor layer comprising active regions for integrated circuit chips and kerf regions adjacent to the active regions. The active regions can comprise devices for the integrated circuit chips and the adjacent kerf regions can comprise test structures for performing wafer-level testing of the integrated circuit chips.

The semiconductor wafer structure can further comprise a stack of interlayer dielectrics above the semiconductor layer, metal structures within the stack of interlayer dielectrics and a passivation layer above the stack of interlayer dielectrics. The metal structures can comprise metal interconnects that extend from devices in active regions of the semiconductor layer to the top surface of the stack of interlayer dielectrics. Optionally, the metal structures can also comprise additional metal interconnects that extend from test structures in kerf regions of the semiconductor layer to the top surface of the stack of interlayer dielectrics. Optionally, the metal structures can also comprise main sections of crackstop structures, which each extend essentially vertically from the semiconductor layer to the top surface of the stack of interlayer dielectrics and which each laterally surround a given active region.

The semiconductor wafer structure one or more under-bump pad(s) and one or more additional metal feature(s) that are different from the under-bump pad(s).

Specifically, each under-bump pad can be aligned above and electrically connected to a metal interconnect, which is at the top surface of the stack of interlayer dielectrics above an active region of the semiconductor layer and which is electrically connected to a device within that active region. Each under-bump pad can comprise a first copper layer and two first metal cap layers stacked on the first copper layer. The first copper layer can have a first lower portion that extends vertically through the passivation layer to the top surface of the stack of interlayer dielectrics. The first copper layer can further have a first upper portion that is above the first lower portion. Optionally, the first upper portion of the first copper cap layer can be wider than the first lower portion such that the first copper layer is essentially T-shaped. The two first metal cap layers can comprise, for example, a first nickel cap layer on and immediately adjacent to the first copper layer and a first copper cap layer on the first nickel cap layer. A solder bump can be positioned on the first copper cap layer of each under-bump pad.

The additional metal feature(s) can comprise any one or more of the following: (1) a wirebond pad, which is aligned above and electrically connected to another metal interconnect at the top surface of the stack of interlayer dielectrics above the active region and which is electrically connected to another device in that active region, so as to provide electrical access to the device through the metal interconnect; (2) a final vertical section of a crackstop structure aligned above a main section of a crackstop structure; and (3) a probe pad, which is aligned above and electrically connected to an additional metal interconnect, which is located at the top surface of the stack of interlayer dielectrics above a kerf region in the semiconductor layer and which is electrically connected to a test structure in that kerf region, so as to provide electrical access to the test structure through the additional metal interconnect. In any case, each additional metal feature can comprise a second copper layer and at least one second metal cap layer on the second copper layer. The second copper layer can comprise a second lower portion that extends vertically through the passivation layer to the top surface of the stack of interlayer dielectrics and a second upper portion above the second lower portion. Optionally, the second upper portion of the second copper layer can be wider than the second lower portion such that the second copper layer of each additional metal feature is essentially T-shaped. The at least one second metal cap layer can comprise, for example, a single second nickel cap layer on and immediately adjacent to the second copper layer. Alternatively, a second nickel cap layer can be on and immediately adjacent to the second copper layer and a second copper cap layer can be on the second nickel cap layer.

In this case, due to processing steps used, the second copper cap layer of each additional metal feature will be relatively thin as compared to the first copper cap layer of each under-bump metal pad.

As mention above, such a semiconductor wafer structure can be diced through the kerf regions to form discrete integrated circuit chips. Thus, also disclosed herein is an integrated circuit chip structure. This integrated circuit chip structure, like the semiconductor wafer structure, can comprise a semiconductor layer and the semiconductor layer can comprise an active region, which comprises one or more devices.

The integrated circuit chip structure can further comprise a stack of interlayer dielectrics above the semiconductor layer, metal structures within the stack of interlayer dielectrics, and a passivation layer above the stack of interlayer dielectrics. The metal structures can comprise metal interconnects that extend from devices in the active region of the semiconductor layer to the top surface of the stack of interlayer dielectrics. Optionally, the metal structures can comprise a main section of a crackstop structure, which extends essentially vertically from the semiconductor layer to the top surface of the stack of interlayer dielectrics and which laterally surrounds the active region.

The integrated circuit chip structure can further comprise one or more under-bump pad(s) and one or more additional metal feature(s) that are different from the under-bump pad(s) and, particularly, that comprise wirebond pad(s) and/or a main section of a crackstop structure, as described in detail above with regard to the semiconductor wafer structure. It should be noted that any probe pads that were aligned above and electrically connected to test structures in the kerf regions of the semiconductor wafer structure would be destroyed during semiconductor wafer structure dicing to form the integrated circuit chips and, thus, the additional metal features of the disclosed integrated circuit chip structure do not include such probe pads.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
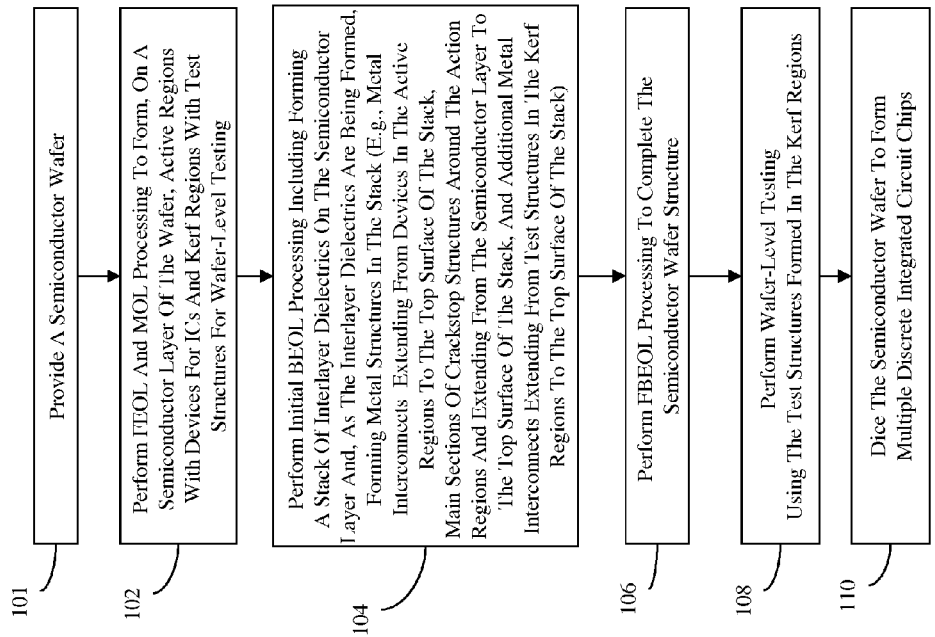
FIG. 1 is a flow diagram of FIG. 1 illustrating a method for far back end of the line (FBEOL) metallization during semiconductor wafer processing for fabrication of integrated circuit chips.

As mentioned above, recently, in an attempt to save on costs, aluminum has been replaced with copper in far back end of line (FBEOL) metallization during integrated circuit chip manufacturing. Specifically, copper has been used instead of aluminum during FBEOL metallization to form metal pads for solder bumps used in controlled collapsed chip connections (C4 connections) (referred to herein as under-bump pads or to herein as solder bump pads) and to simultaneously form additional metal features, such as metal pads for providing electrical access to on-chip devices (e.g., for providing electrical connections between on-chip devices and a printed circuit board (PCB)) (referred to herein as wirebond pads), metal pads for providing electrical access to kerf region (i.e., scribe line) test structures (referred to herein as probe pads), and final (i.e., uppermost) vertical sections of crackstop structures, which extend vertically from the final metallization layer down to the active device layer and border the chips in order to inhibit damage during wafer dicing and chip packaging. Unfortunately, current FBEOL metallization techniques for forming both under-bump pads and additional metal features using copper are not optimal because the surface and bulk copper of the additional metal features is left exposed during subsequent wafer finishing processes (e.g., C4 connection formation processes) and, thereby leave such additional metal features at risk of processing-related defects (e.g., etch back, oxidation, etc.), which could impact their final integrity, if development and manufacturing-level optimization activity does not fully succeed.

In view of the foregoing, disclosed herein is an improved method for far back end of the line (FBEOL) metallization during semiconductor wafer processing. Specifically, after front end of the line (FEOL), middle of the line (MOL) and initial back end of the line (BEOL) processing of a semiconductor wafer, a passivation layer can be formed and patterned with first openings aligned above and extending vertically to metal structures below (e.g., to interconnect structure or main sections of crackstop structures). A mask layer can be formed on the passivation layer and patterned with second openings aligned above the first openings, thereby forming two-tier openings extending vertically through the mask layer and passivation layer to the structures below. A first electrodeposition process can be performed in order to form, in the two-tier openings, both under-bump pad(s) and additional metal feature(s), which are different from the under-bump pad(s) (e.g., a wirebond pad, a final vertical section of a crackstop structure, and/or a probe pad). Each under-bump pad and additional metal feature can initially be formed so as to comprise copper with metal cap layers thereon. The mask layer can then be removed and an additional mask layer can be formed and patterned with third opening(s) exposing only the under-bump pad(s). Then, a second electrodeposition process can be performed in order to deposit solder material on the under-bump pad(s). During subsequent semiconductor wafer and integrated circuit chip processing, the metal cap layers can protect the additional metal feature(s) from etchback, oxidation, etc. Also disclosed herein are semiconductor structures (e.g., a semiconductor wafer structure and an integrated circuit chip structure), which can be formed using the above-described method.

More particularly, referring to the flow diagram of FIG. 1, disclosed herein is an improved method for far back end of the line (FBEOL) metallization during semiconductor wafer processing for fabrication of integrated circuit chips.

Specifically, prior to performing the disclosed FBEOL metallization method, a semiconductor wafer can be provided (101). This semiconductor wafer can comprise, for example, a semiconductor-on-insulator (SOI) wafer or, alternatively, a bulk semiconductor wafer.

Figure 2:
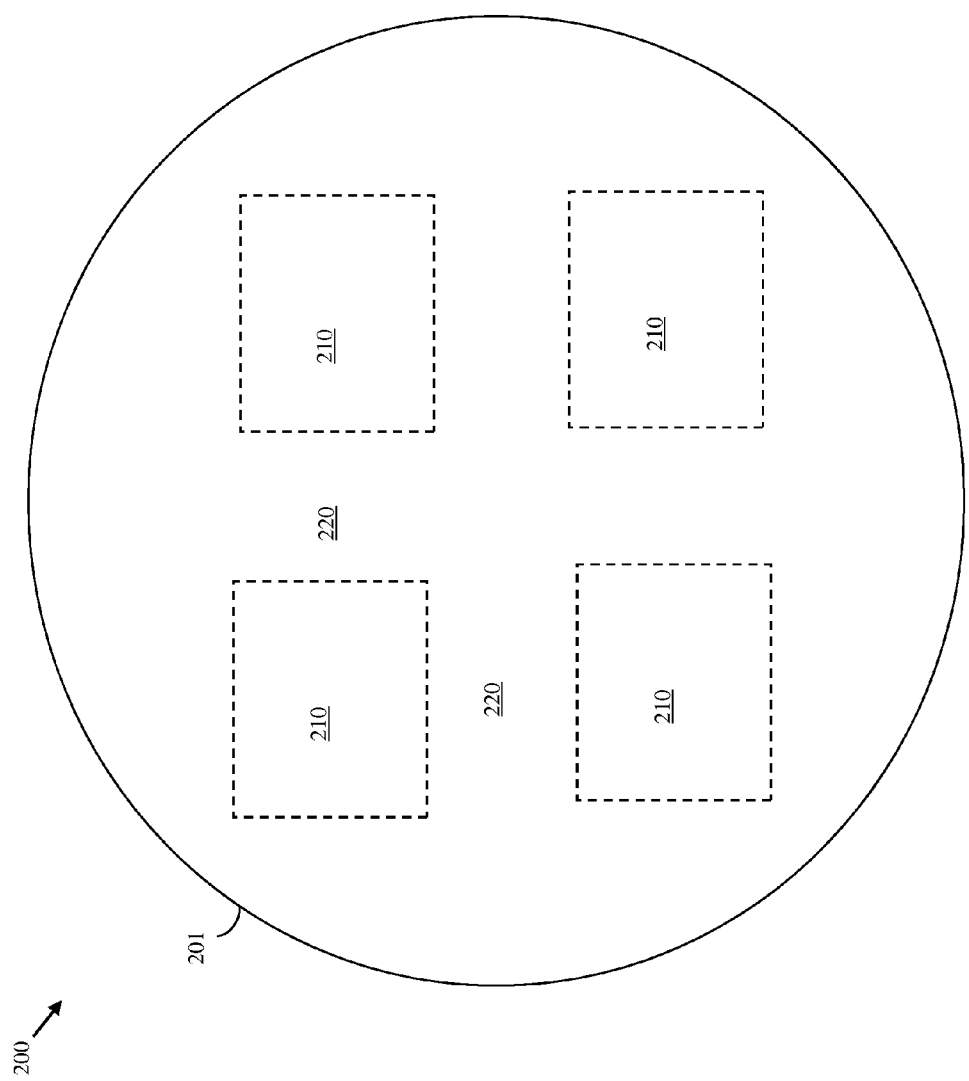
FIG. 2 is a top view diagram showing a partially completed semiconductor wafer structure formed according to the flow diagram of FIG. 1.
Figure 3:
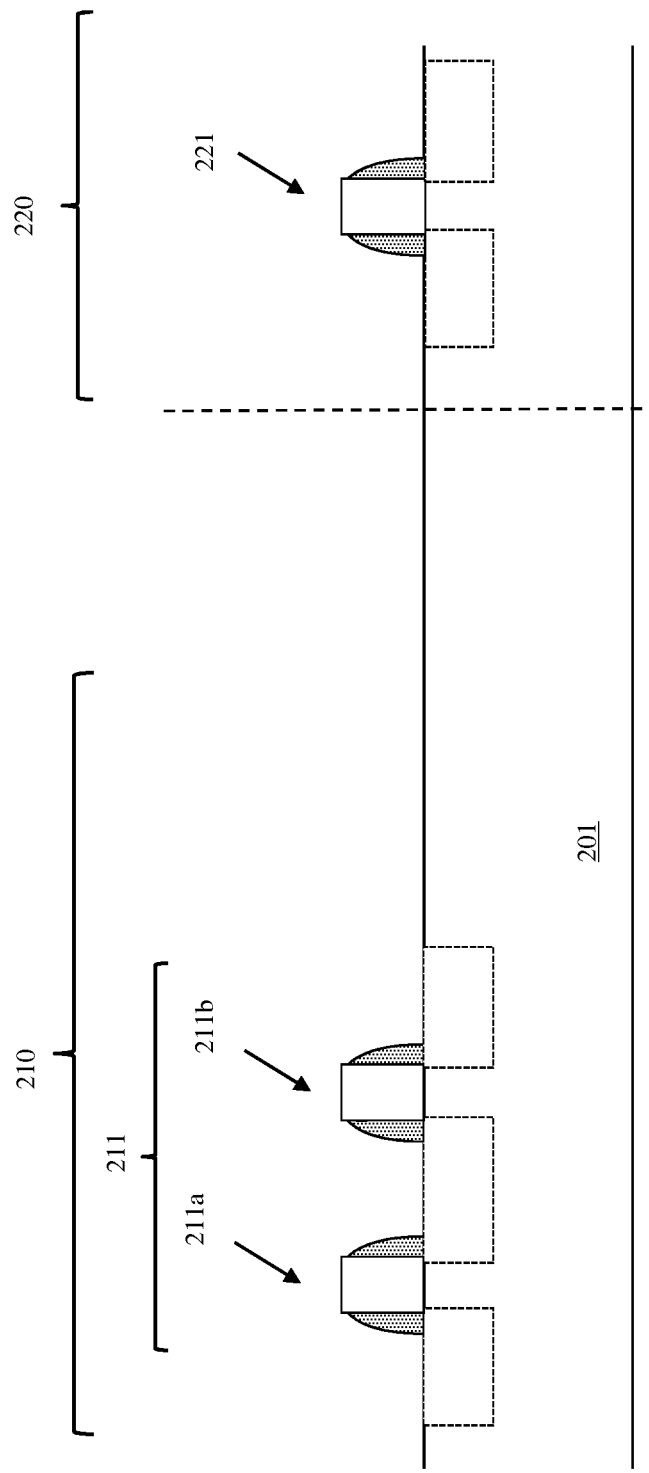
FIG. 3 is a cross-section view diagram showing a portion of a partially completed semiconductor wafer of FIG. 2.

Next, conventional front end of the line (FEOL) and middle of the line (MOL) processing of the semiconductor wafer 200 can be performed in order to form, on a semiconductor layer 201 of the semiconductor wafer 200, both active regions 210 for integrated circuit chips and kerf regions 220 adjacent to the active regions 210 (102, see the top view diagram of FIG. 2 showing the partially completed semiconductor wafer structure and the a cross-section view diagram of FIG. 3 showing a portion of the partially completed semiconductor wafer at the interface between an active region 210 and an adjacent kerf region 220). It should be noted that on a SOI wafer, the semiconductor layer 201 can comprise a single crystalline semiconductor layer (e.g., a single crystalline silicon layer) on an insulator layer (e.g., a buried oxide (BOX) layer) above a semiconductor substrate (e.g., a silicon substrate), whereas on a bulk semiconductor wafer, the semiconductor layer 201 can comprise a bulk semiconductor substrate (e.g., bulk silicon substrate). It should further be noted that, for illustration purposes, only four active regions 210 for four integrated circuit chips are shown in FIG. 2; however, those skilled in the art will recognize that this number will vary as a function of the integrated circuit chip size, the wafer size, the reticle layout, etc.

In any case, as a result of FEOL and MOL processing 102, as illustrated in FIG. 3, each active region 210 on the semiconductor layer 201 can comprise a plurality of devices 211 for an integrated circuit chip (e.g., see devices 211a and 211b) and the adjacent kerf regions 220 can comprise one or more test structures 221 for performing wafer-level testing of the integrated circuit chip. For purposes of illustration, the devices 211 in the active regions 210 and the test structures 221 in the kerf regions 220 are all shown as being conventional planar field effect transistors. However, it should be understood that the devices 211 can comprise any number of suitable integrated circuit devices (e.g., planar field effect transistors, non-planar field effect transistors, bipolar transistors, capacitors, diodes, etc.), according to the design of the integrated circuit chip. Similarly, the test structures 221 can comprise any number of suitable test devices (e.g., planar field effect transistors, non-planar field effect transistors, bipolar transistors, capacitors, diodes, etc.) or parametric measurement macros suitable for wafer-level testing of the integrated circuit chips, as designed.

Figure 4:
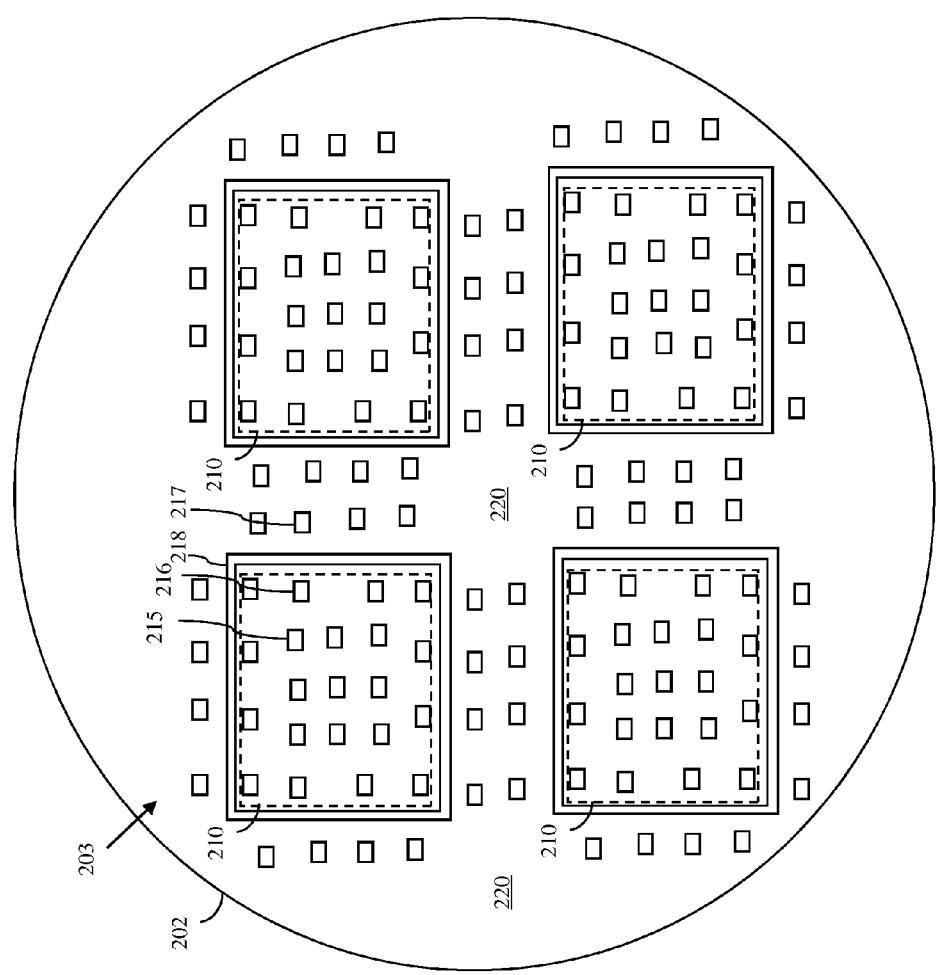
FIG. 4 is a top view diagram showing a partially completed semiconductor wafer structure formed according to the flow diagram of FIG. 1.
Figure 5:
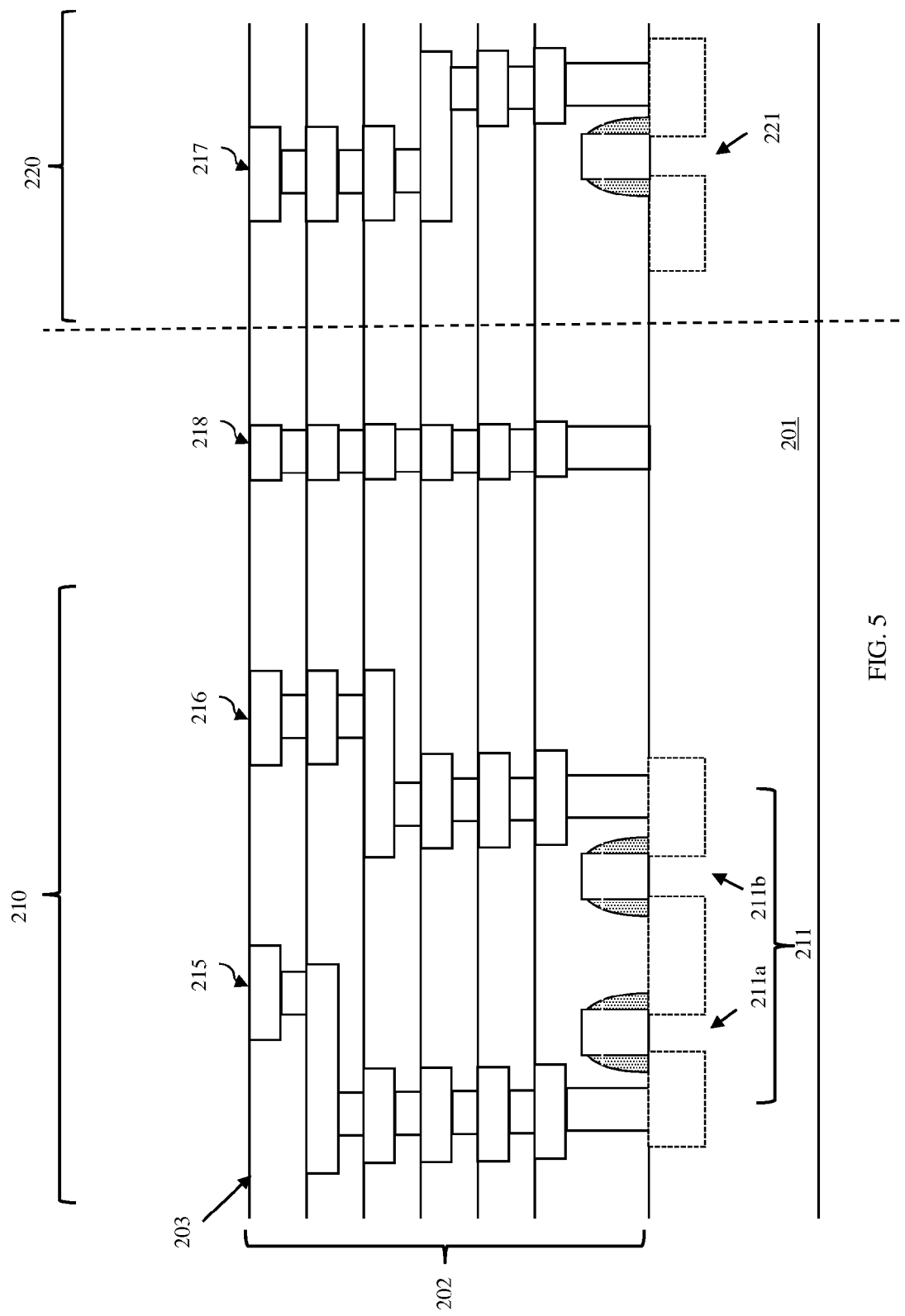
FIG. 5 is a cross-section view diagram showing a portion of a partially completed semiconductor wafer structure of FIG. 4.

Next, initial back end of the line (BEOL) processing of the semiconductor wafer 200 can be performed (104, see the top view diagram of FIG. 4 showing the partially completed semiconductor wafer structure and the cross-section view diagram of FIG. 5 showing a portion of the partially completed semiconductor wafer structure at the interface between an active region 210 and an adjacent kerf region 220). Specifically, during initial BEOL processing 104, a stack 202 of interlayer dielectrics can be formed above the semiconductor layer 201 so as to cover the active regions 210 and the kerf regions 220. The stack 202 of interlayer dielectrics can be formed by depositing multiple layers of any of the following dielectric materials alone and/or in combination: silicon dioxide ($SiO_2$), a silicon nitride (SiN), borophosphosilicate glass (BPSG), etc.

During initial BEOL processing 104 and, particularly, as the stack 202 of interlayer dielectrics is being formed, multiple metal structures 215-218 can be formed within the stack 202. Specifically, during initial BEOL processing 104, metal interconnects 215-216 can be formed within the stack 202. Each of these metal interconnects 215-216 can comprise, for example, a combination of metal wires and/or vias that extend from a device (e.g., device 211a or device 211b) in an active region 210 of the semiconductor layer 201 to the top surface 203 of the stack 202. Similarly, during initial BEOL processing 104, additional metal interconnect(s) 217 can also be formed within the stack 202. Each additional metal interconnect 217 comprise, for example, an additional combination of metal wires and vias that extend from a test structure 221 in a kerf region 220 of the semiconductor layer 201 to the top surface 203 of the stack 202. Additionally or alternatively, during BEOL processing 104, main section(s) 218 of crackstop structures can be formed within the stack 202. As mentioned above, a crackstop structure is designed to inhibit damage during subsequent semiconductor wafer dicing and integrated circuit chip packaging. Each main section 218 of a crackstop structure can comprise, for example, a stack of metal wires and/or vias, which extends essentially vertically from the semiconductor layer 201 to the top surface 203 of the stack 202 and which laterally surrounds a given active region 210 and, thereby physically separates that given active region 210 from the adjacent kerf regions 220 (e.g., as illustrated in U.S. Pat. No. 6,022,791 of Cook et al., issued on Feb. 8, 2000, assigned to International Business Machines Corporation and incorporated herein by reference).

Techniques for performing the above-described initial BEOL processing (e.g., damascene and dual-damascene techniques for forming the above-described metal structures within interlayer dielectrics) are well known in the art and, thus, the details of such techniques are omitted from this specification in order to allow the reader to focus on the salient aspects of the method. Similarly, the dielectric and metal materials used during such initial BEOL processing are also well known in the art and, thus, the details of such materials are omitted from this specification in order to allow the reader to focus on the salient aspects of the method.

Figure 6:
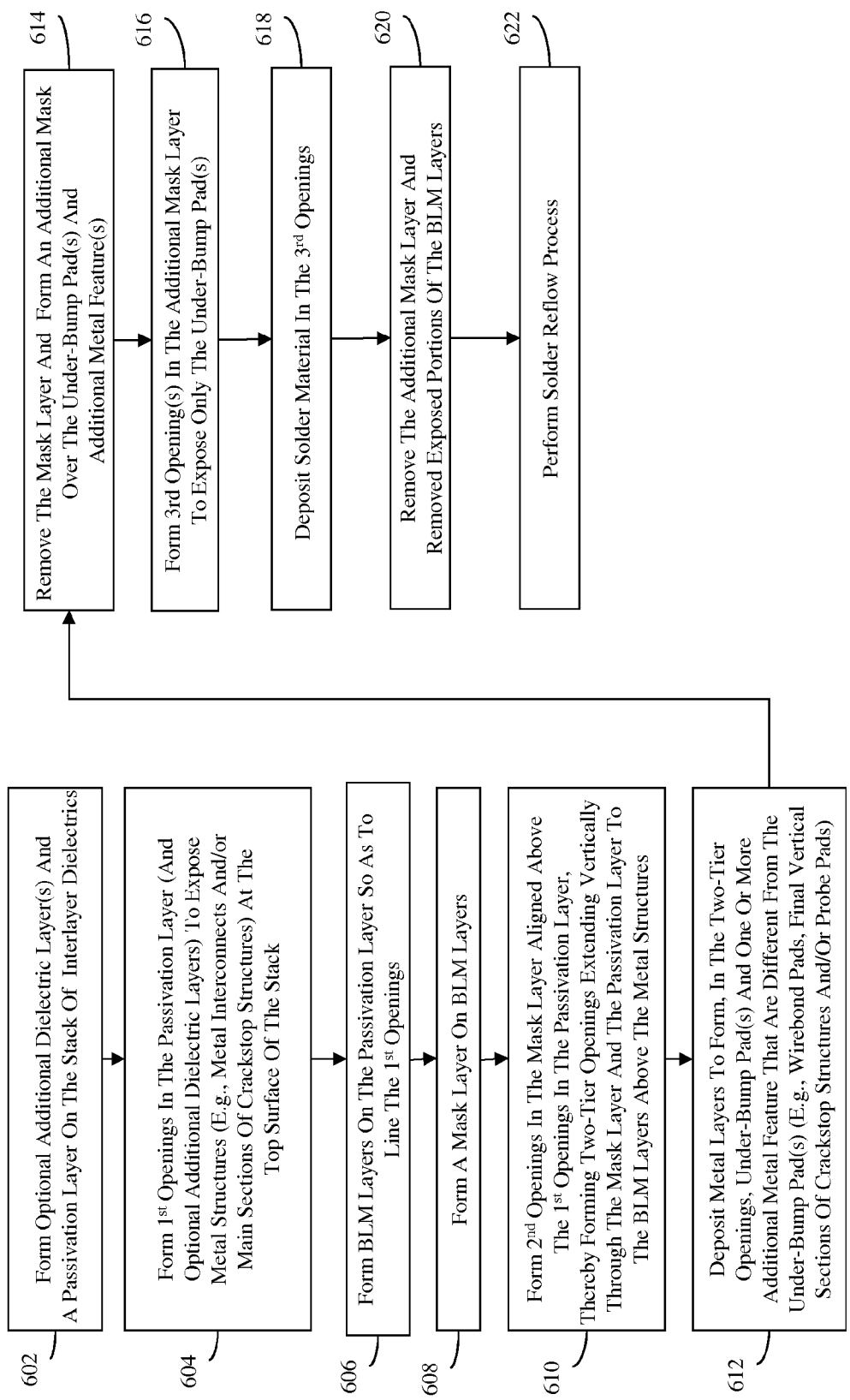
FIG. 6 is a flow diagram illustrating in greater detail process 106 of FIG. 1.
Figure 7:
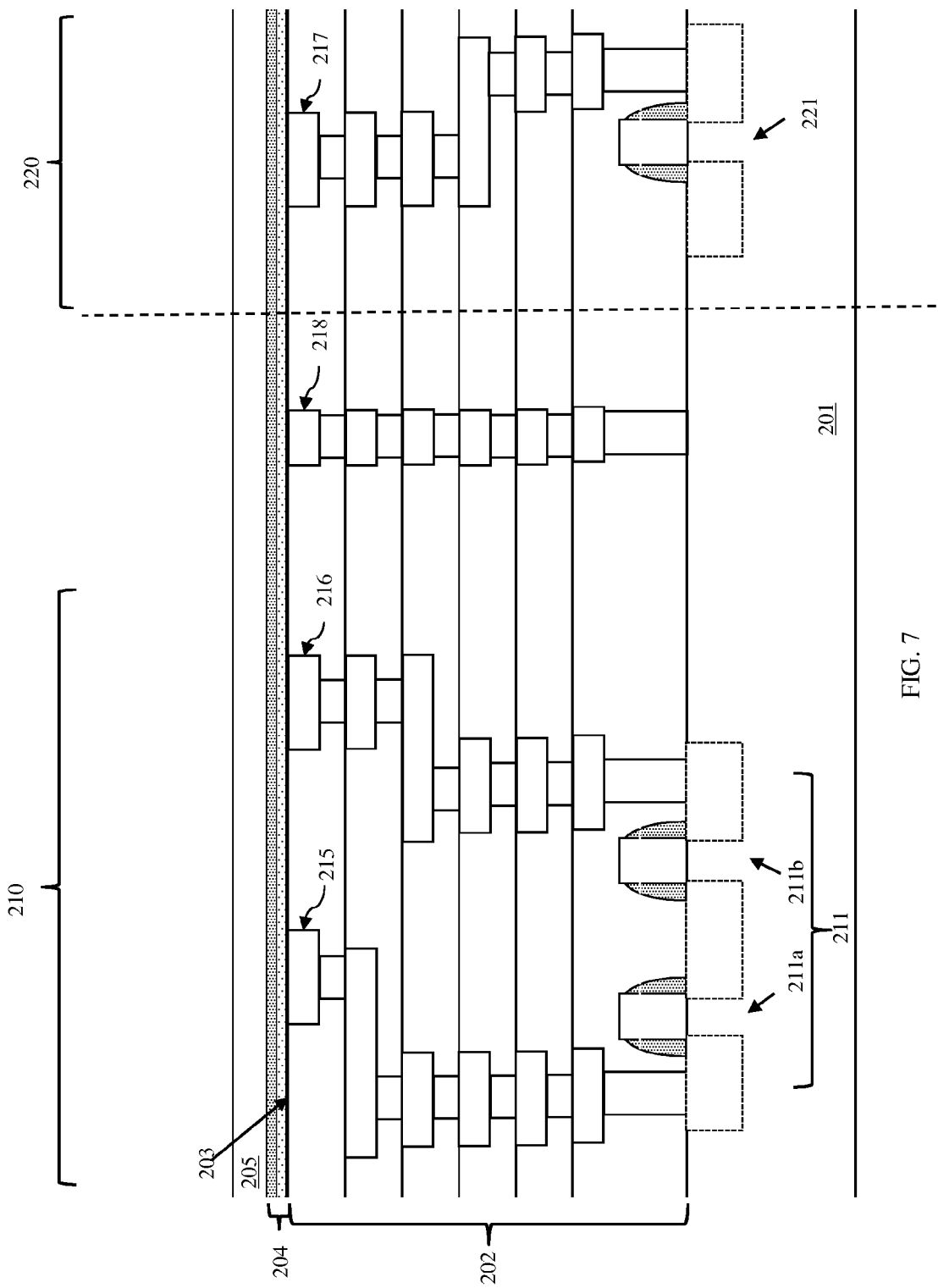
FIG. 7 is a cross-section view diagram showing a portion of a partially completed semiconductor wafer structure formed according to the flow diagram of FIG. 6.

The method disclosed herein relates to the performance of far back end of the line (FBEOL) processing (106), which can begin following the initial BEOL processing 104. Specifically, referring to the flow diagram of FIG. 6, FBEOL processing 106 begins with the optional formation (e.g., by chemical vapor deposition (CVD)) of one or more additional dielectric layers 204 on the top surface 203 of the stack 202 of interlayer dielectrics over exposed surfaces of the metal structures 215-218 and the formation (e.g., also by CVD) of a passivation layer 205 on any additional dielectric layers 204 (602, see FIG. 7). The additional dielectric layer(s) 204 can comprise, for example, a silicon oxide layer and a silicon nitride layer on the silicon oxide layer. The passivation layer 205 can comprise, for example, a photosensitive polyimide (PSPI) layer on the silicon nitride layer.

Figure 8:
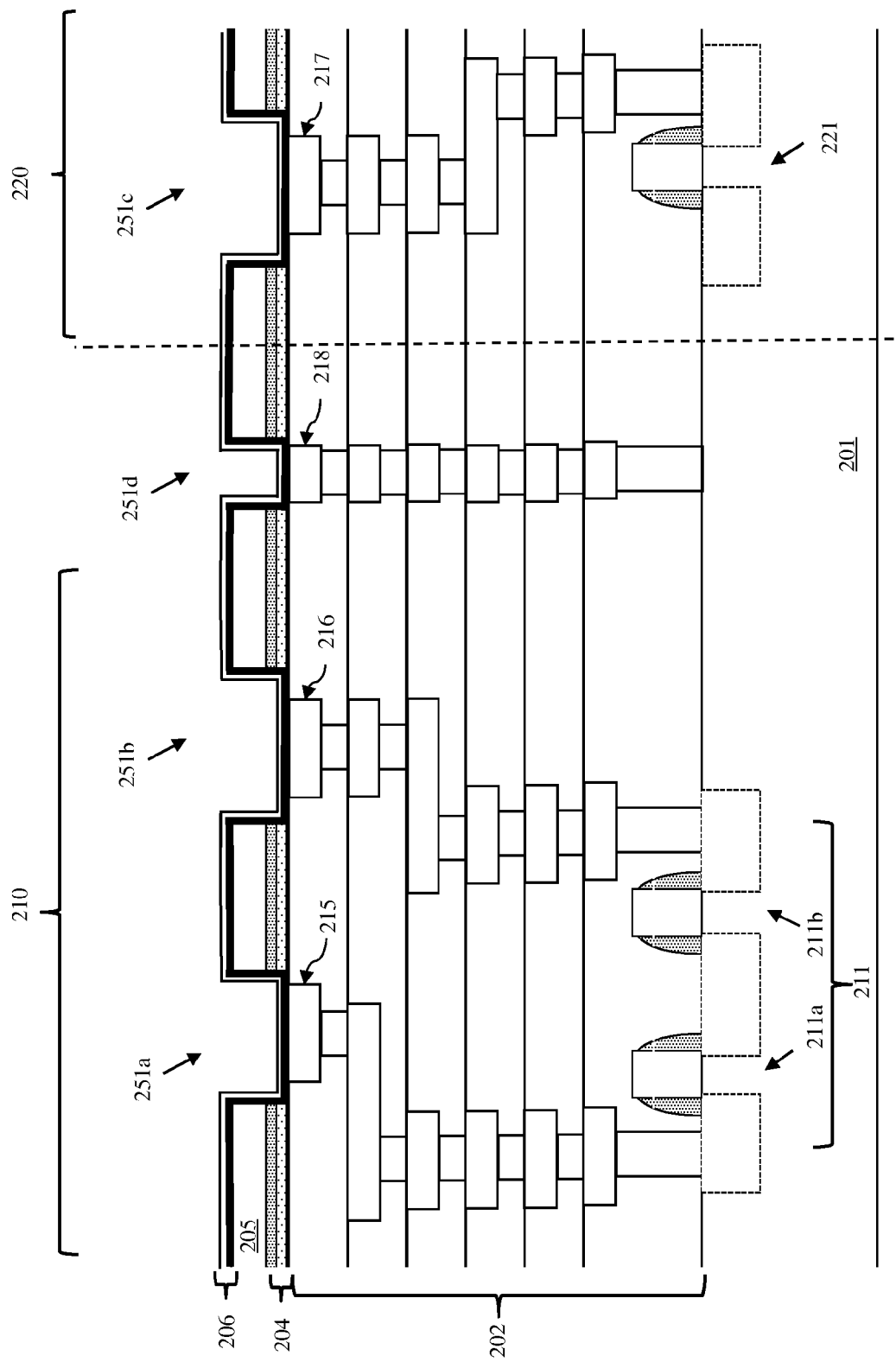
FIG. 8 is a cross-section view diagram showing a portion of a partially completed semiconductor wafer structure formed according to the flow diagram of FIG. 6.

After the passivation layer 205 is formed above the top surface 203 of the stack 202, first openings (e.g., see first openings 251a-d) can be formed in the passivation layer 205 (604, see FIG. 8). Specifically, these first openings 251a-d can be lithographically patterned and etched such that they extend vertically through the passivation layer 205 and any additional dielectric layers 204 and such that they are aligned above and expose the top surfaces of specific metal structures 215-218 (e.g., metal interconnects 215-216 electrically connected to devices 211a-b in an active region 210, an additional metal interconnect 217 electrically connected to a test structure 221 in a kerf region 220 and/or a main section 218 of a crackstop structure), respectively, at the top surface 203 of the stack 202 of interlayer dielectrics.

After the first openings 251a-d are formed, optionally, one or more ball limiting metallurgy layers 206 can be conformally deposited over the passivation layer 205 so as to cover the top surface of the passivation layer 205 and line the first openings 251a-d (606, see FIG. 8). These BLM layers 206 can comprise, for example, an adhesion BLM layer and a solder wetting BLM layer on the adhesion BLM layer. The adhesion BLM layer can comprise, for example, a titanium-tungsten BLM layer, a chromium BLM layer, a titanium BLM layer or any other suitable BLM layer selected to enhance adhesion. This adhesion BLM layer can be relatively thin (e.g., 0.01 to 0.25 microns). The solder wetting BLM layer can comprise, for example, a copper BLM layer on the adhesion BLM layer. This solder wetting BLM layer can be relatively thick as compared to the adhesion BLM layer (e.g., 0.1 to 2.0 microns).

Figure 9:
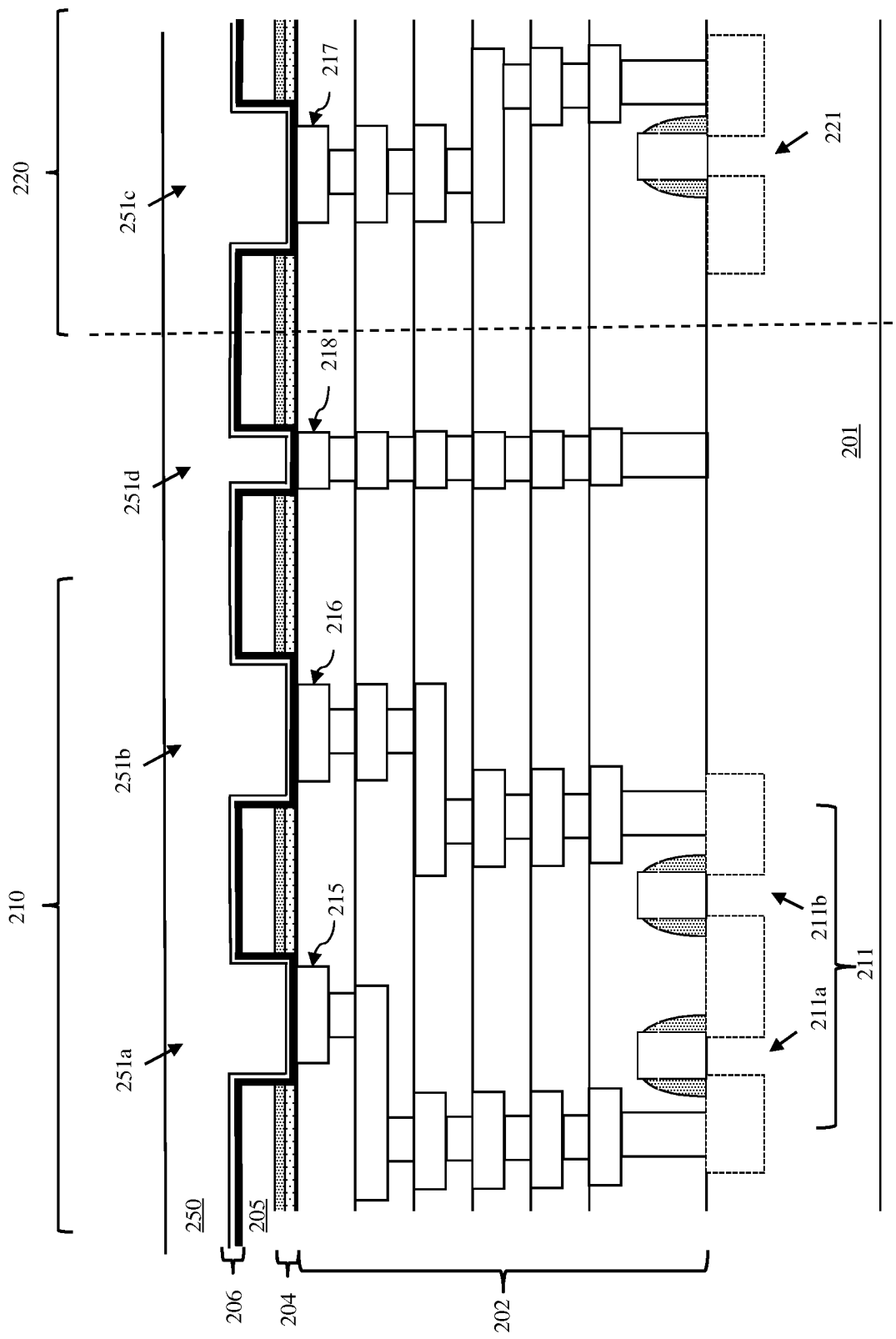
FIG. 9 is a cross-section view diagram showing a portion of a partially completed semiconductor wafer structure formed according to the flow diagram of FIG. 6.
Figure 10:
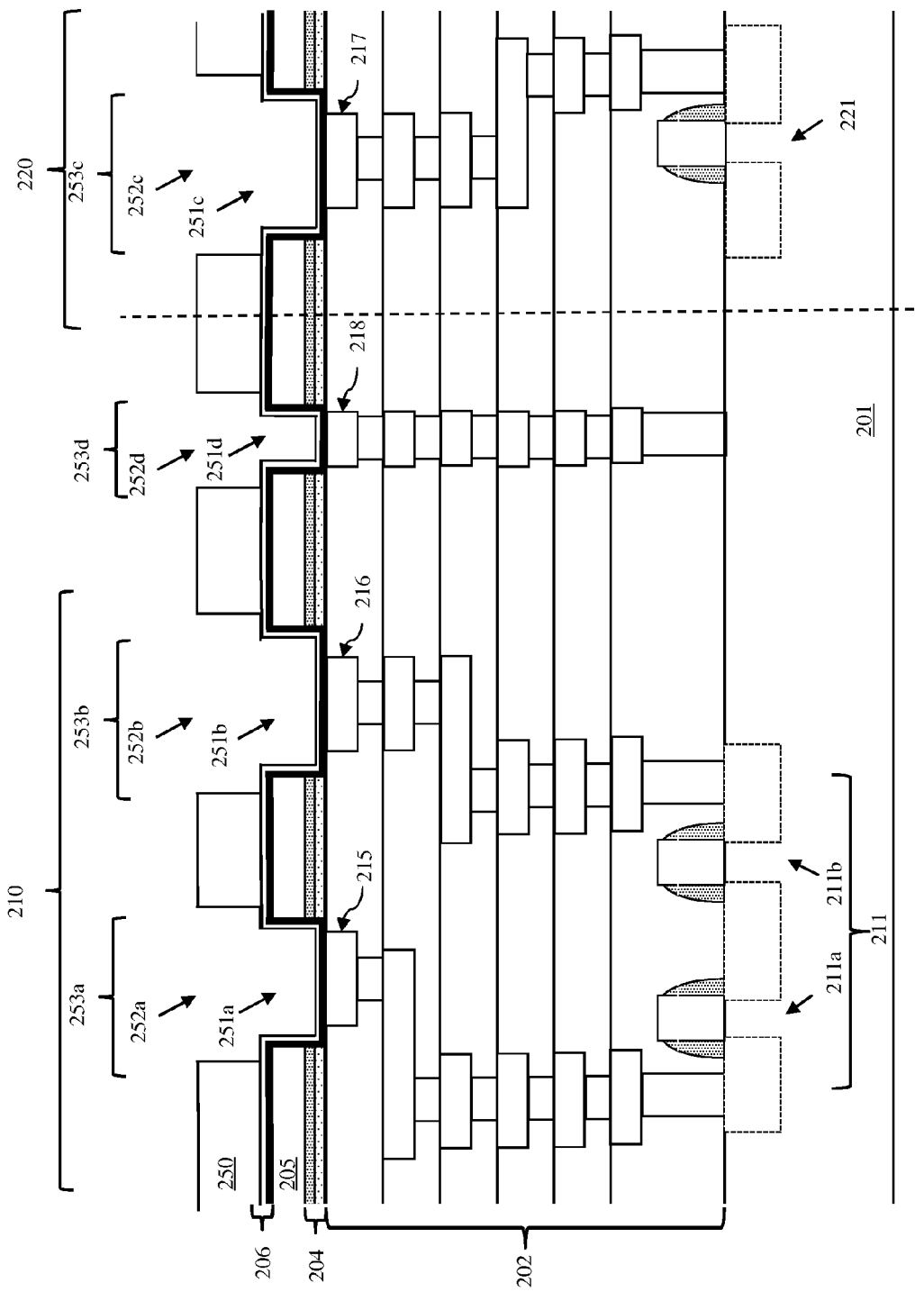
FIG. 10 is a cross-section view diagram showing a portion of a partially completed semiconductor wafer structure formed according to the flow diagram of FIG. 6.

After the BLM layers 206 are formed at process 606, a mask layer 250 can be formed over the BLM layers 206, filling the first openings 251a-d (608, see FIG. 9). This mask layer 250 can comprise, for example, a photoresist layer or any other suitable mask layer. Second openings 252a-d can then be formed in the mask layer 250 (610, see FIG. 10). Specifically, second openings 252a-d can be lithographically patterned and etched in the mask layer 250 such that they extend vertically through the mask layer 250 and such that they are aligned above the first openings 251a-d, respectively, thereby forming two-tier openings 253a-d, respectively, that extend vertically through the mask layer 250, the passivation layer 205 and any additional dielectric layers 204 to expose the uppermost BLM layer 206 on the metal structures 215-218 below. Optionally, the second openings 252a-d in the mask layer 250 can be wider than the first openings 251a-d in the passivation layer 205 below.

Figure 11:
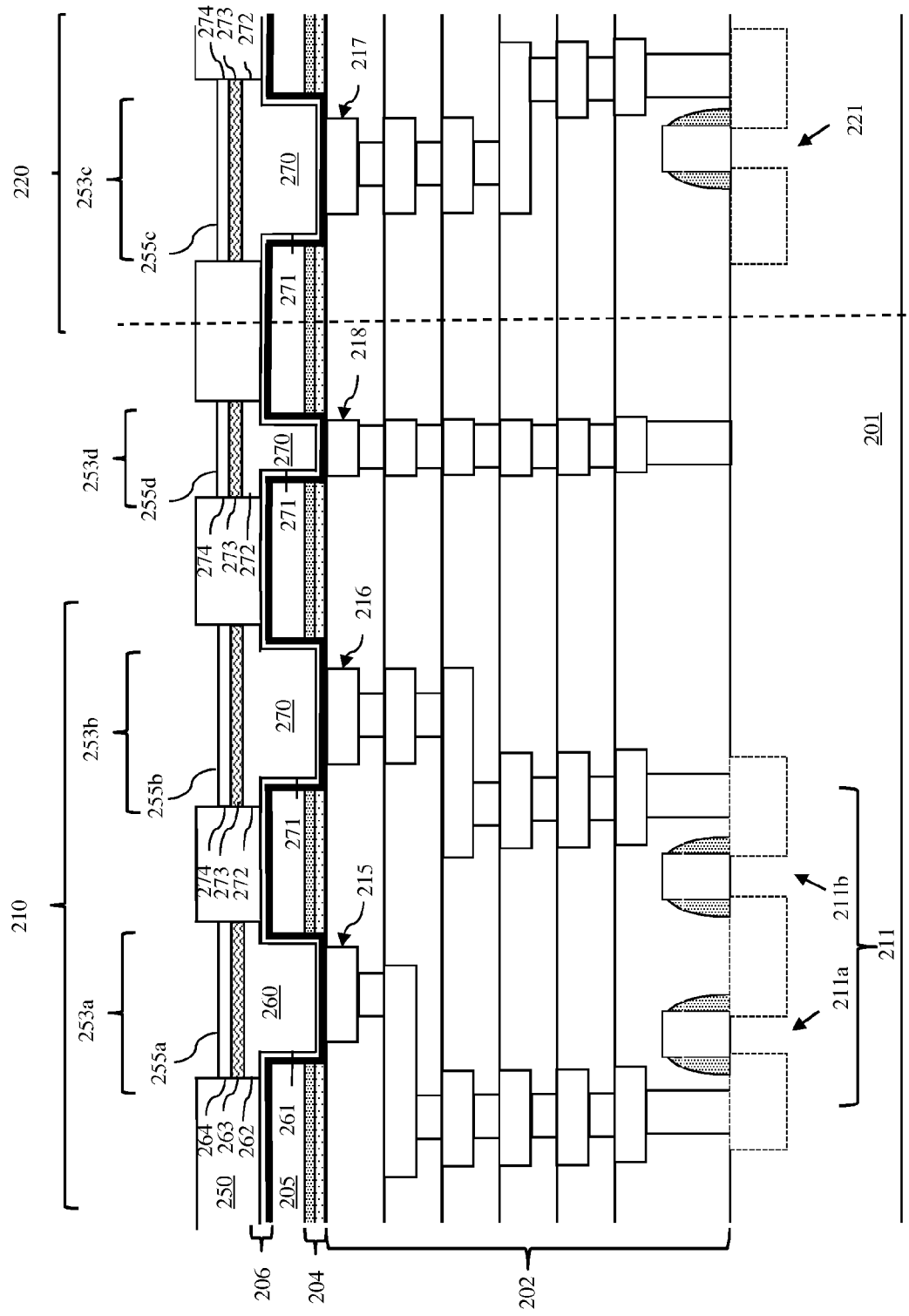
FIG. 11 is a cross-section view diagram showing a portion of a partially completed semiconductor wafer structure formed according to the flow diagram of FIG. 6.

Next, metal layers can be deposited (e.g., by a first electrodeposition process) into the two-tier openings 253a-d so as to essentially simultaneously form at least: under-bump pad(s) 255a in any first two-tier opening(s) 253a and one or more additional metal features, which are different from the under-bump pad, in corresponding second two-tier openings (e.g., wirebond pad(s) 255b in two-tier opening(s) 253b, probe pad(s) 255c in two-tier opening(s) 253c and/or final vertical section(s) 255d of crackstop structure(s) in two-tier opening(s) 253d) (612, see FIG. 11).

Specifically, each first two-tier opening 253a can be aligned above a specific metal interconnect 215, which is at the top surface 203 of stack 202 of interlayer dielectrics and electrically connected to a device 211a in an active region 210 of the semiconductor layer 201. The first electrodeposition process can be performed such that, in each first two-tier opening 253a, the resulting under-bump pad 255a comprises a first copper layer 260 (also referred to herein as a first copper plug) and two first metal cap layers 263-264 stacked on the first copper layer 260. The first copper layer 260 can have a first lower portion 261 that extends vertically through the passivation layer 205 and any additional dielectric layers 204 so that it is electrically connected to the metal interconnect 215 (e.g., through the BLM layers 206) and a first upper portion 262 above the first lower portion 261. The two first metal cap layers 263-264 can comprise, for example, a first nickel cap layer 263 and a first copper cap layer 264 on the first nickel cap layer 263.

The additional metal feature(s) can comprise, for example, wirebond pad(s) 255b that provide electrical access to device(s) 211b through metal interconnect(s) 216, probe pad(s) 255c that provide electrical access to test structure(s) 221 through additional metal interconnect(s) 217 and/or final vertical section(s) 255d of crackstop structure(s) on main section(s) 218 of such crackstop structure(s). Thus, the alignment of the second two-tier opening(s) 253b-d formed at process 610 will depend upon the type of additional metal feature(s) being formed. For example, for wirebond pad(s) 255b, each second two-tier opening 253b can be aligned above another metal interconnect 216, which is at the top surface 203 of stack 202 of interlayer dielectrics and electrically connected to another device 211b in the active region 210 of the semiconductor layer 201. For probe pad(s) 255c, each second two-tier opening 253c can be aligned above an additional metal interconnect 217, which is at the top surface 203 of the stack 202 of interlayer dielectrics and electrically connected to a test structure 221 in a kerf region 220 of the semiconductor layer 201. For final vertical section(s) 255d of crackstop structures, each second two-tier opening 255d can be aligned above a previously formed main section 218 of a crackstop structure.

In any case, the first electrodeposition process 612 can be performed such that, in each second two-tier opening (e.g., 253b, 253c and/or 253d), the resulting additional metal feature (e.g., 255b, 255c and/or 255d, respectively), like the under-bump pad 255a, comprises a copper layer and two metal cap layers stacked on the copper layer. Specifically, each additional metal feature (e.g., 255b, 255c and/or 255d) can comprise a second copper layer 270 (also referred herein as a second copper plug) and two second metal cap layers 273-274 on the second copper layer 270. The second copper layer 270 can have a second lower portion 271 that extends vertically through the passivation layer 205 and any additional dielectric layers 204 so that it is connected (e.g., through the BLM layers 206) to a corresponding metal structure below and a second upper portion 272 above the second lower portion 271. The two second metal cap layers 273-274 can comprise, for example, a second nickel cap layer 273 and a second copper cap layer 274 on the second nickel cap layer 273.

It should be noted that if the second openings 252a-d formed at process 610 in the mask layer 250 are wider than the first openings 251a-c in the passivation layer 205 below, as mentioned above and shown in FIG. 10, then the first upper portion 262 of the first copper layer 260 of each under-bump pad 255a will be wider than the first lower portion 261 (i.e., the first copper layer 260 of each under-bump pad will be essentially T-shaped) and, similarly, the second upper portion 272 of the second copper layer 270 of each additional metal feature (e.g., 255b, 255c or 255d) will be wider than the second lower portion 271 (i.e., the second copper layer 270 of each additional metal feature will also be essentially T-shaped), as shown in FIG. 11.

It should further be noted that the height of the lower portions 261, 271 of the first and second copper layers 260, 270 will be a function of the combined thicknesses of the additional dielectric layers 204 and the passivation layer 205 (e.g., 3.0-10.0 microns). Furthermore, the overall height of the first and second copper layers 260, 270 will be a function of the amount of time copper deposition continues after the top surface of the passivation layer 205 is reached. Thus, for example, the overall height of the first and second copper layers 260, 270 can range from 4.0 to 20.0 microns or greater. Additionally, it should be noted that the metal cap layers 263-264, 273-274 can be simultaneously deposited so as to have a combined thickness of 1.0 to 4.0 microns. For example, the first and second nickel cap layers 263, 273 can be simultaneously deposited so that they each have a thickness of 0.5 to 2.0 microns above the first and second copper layers 260, 270, respectively. Similarly, the first and second copper cap layers 264, 274 can be simultaneously deposited so that they each have a thickness of 0.5 to 2.0 microns above the first and second nickel cap layers 263, 273, respectively.

Figure 12:
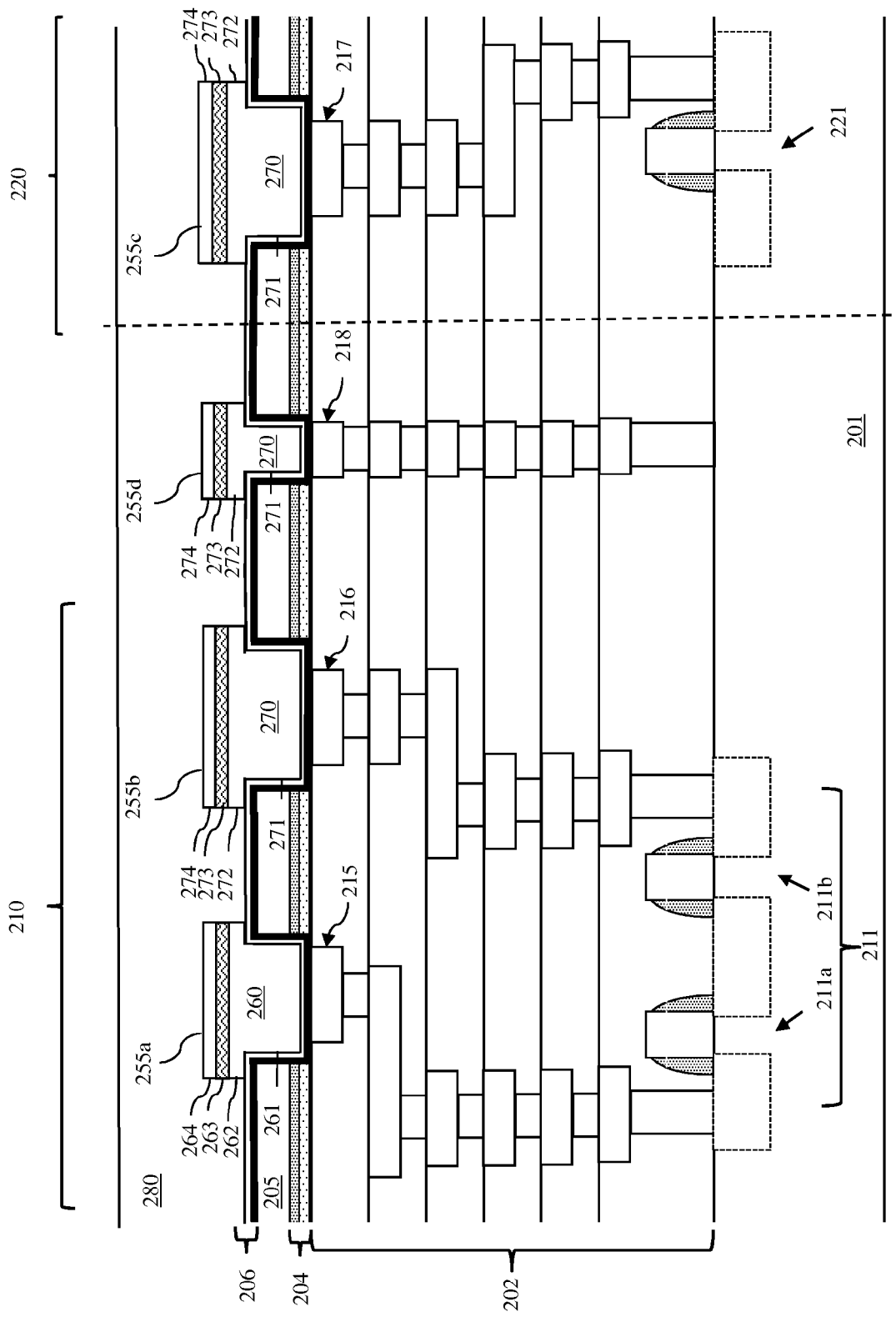
FIG. 12 is a cross-section view diagram showing a portion of a partially completed semiconductor wafer structure formed according to the flow diagram of FIG. 6.
Figure 13:
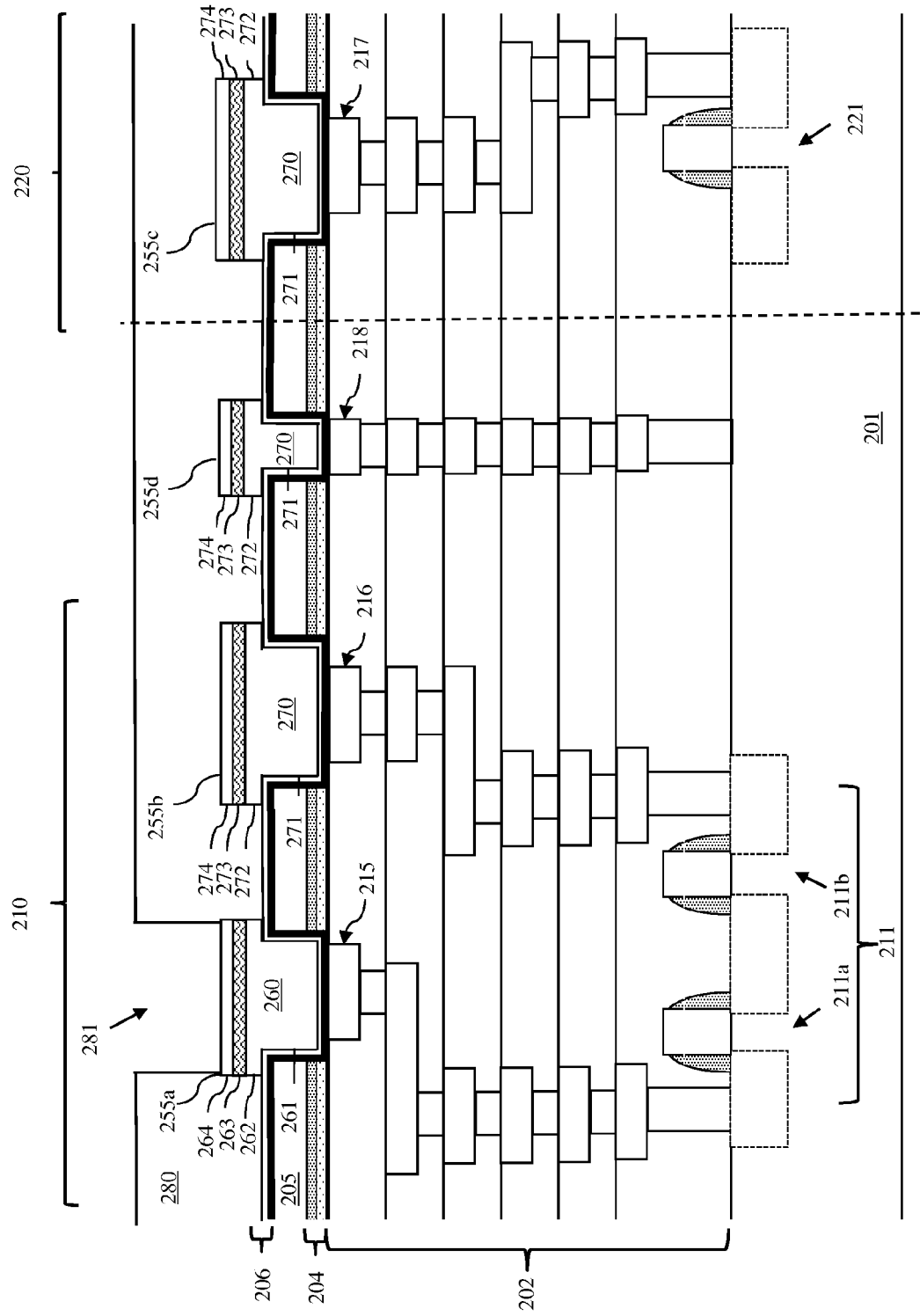
FIG. 13 is a cross-section view diagram showing a portion of a partially completed semiconductor wafer structure formed according to the flow diagram of FIG. 6.

After the first electrodeposition process 612, the mask layer 250 can be removed and an additional mask layer 280 can be formed on the passivation layer 205 such that the under-bump pad(s) 255a and additional metal feature(s) 255b-d are covered (614, see FIG. 12). This additional mask layer 280 can comprise, for example, another photoresist layer or any other suitable mask layer. Then, third opening(s) 281 can then be formed (e.g., lithographically patterned and etched) in this additional mask layer 280 such that each third opening 281 is aligned above and exposes an under-bump pad 255a only (i.e., such that the additional metal feature(s) 255b-c remains masked) (616, see FIG. 13). It should be noted that each third opening 281 can be slightly smaller than the under-bump pad 255a, approximately the same size as the under-bump pad 255a (as shown) or, alternatively, slightly larger than the under-bump pad 255a such that it overlaps the pad edge.

Figure 14:
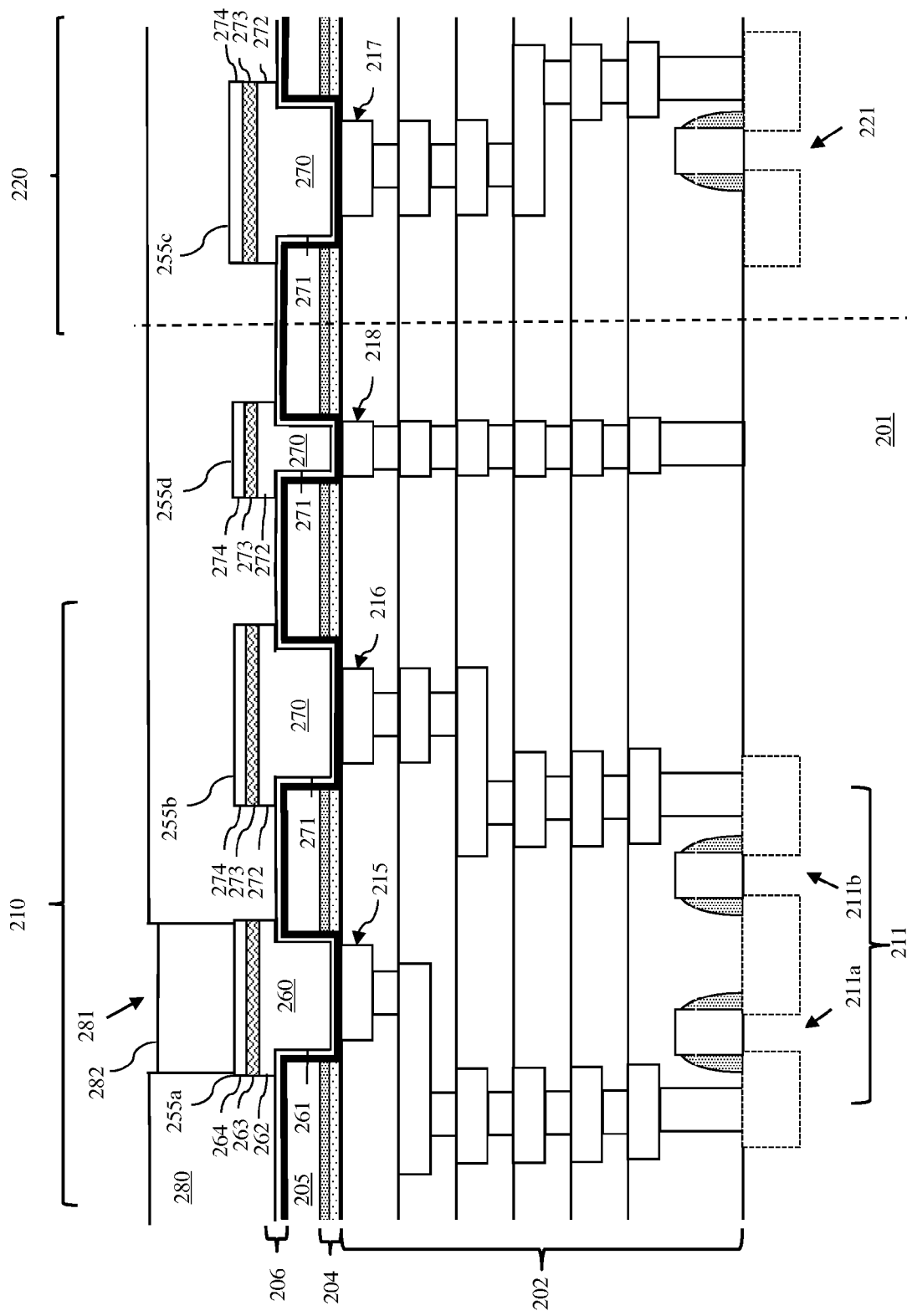
FIG. 14 is a cross-section view diagram showing a portion of a partially completed semiconductor wafer structure formed according to the flow diagram of FIG. 6.

Next, solder material 282 can be deposited (e.g., by a second electrodeposition process) in the third opening(s) 281 and, specifically, onto the exposed under-bump pad (618, see FIG. 14). The solder material 282 can comprise, for example, tin, tin silver, copper sliver, bismuth, indium, zinc, antimony or any other suitable alloys thereof or any other suitable solder material having a reflow temperature that is lower than the melting temperature of the metal layers in the first electrodeposition process 612 discussed in detail above. Following solder material deposition at process 618, the additional mask layer 280 can be selectively removed and exposed portions of the BLM layers 206 on the top surface of the passivation layer 205 can be removed (e.g., by a wet etch process) (620, see the cross-section view diagram of FIG. 15A showing a portion of the partially completed semiconductor wafer structure or see the alternative cross-section view diagram of FIG. 15B showing a portion of the partially completed semiconductor wafer structure).

Figure 15A:
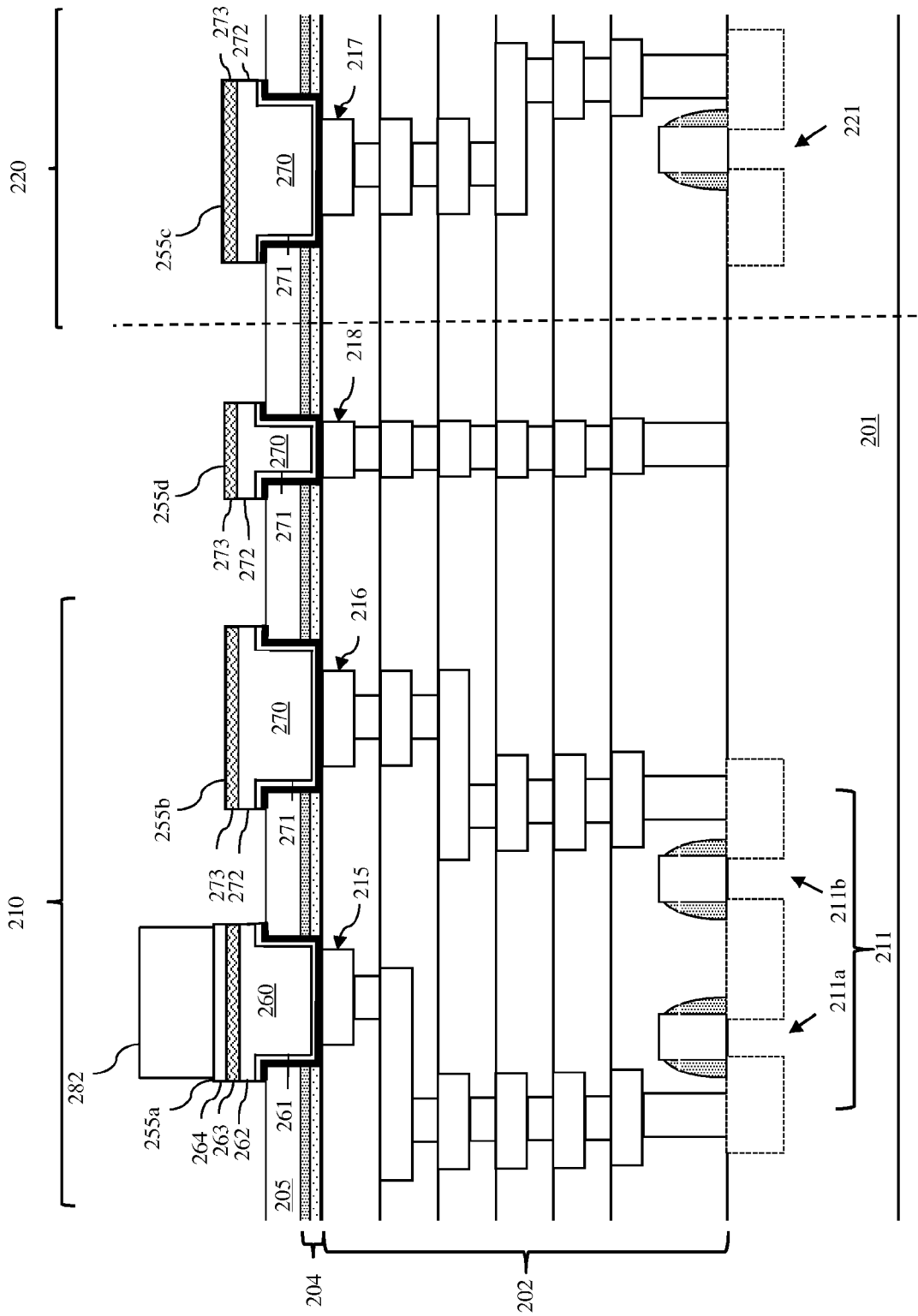
FIG. 15A is a cross-section view diagram showing a portion of a partially completed semiconductor wafer structure formed according to the flow diagram of FIG. 6.
Figure 15B:
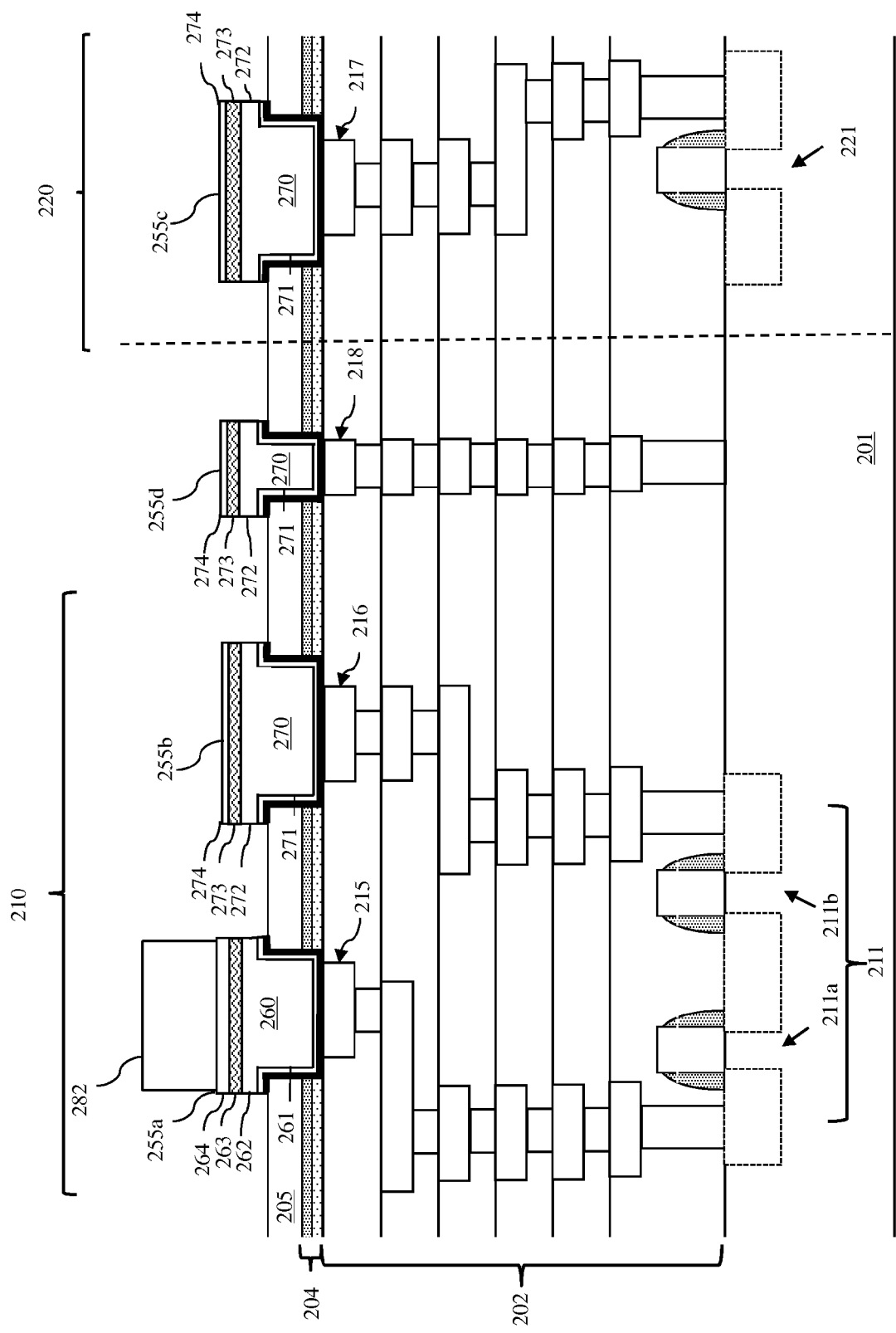
FIG. 15B is an alternative cross-section view diagram showing a portion of a partially completed semiconductor wafer structure formed according to the flow diagram of FIG. 6.

It should be noted that, as illustrated in FIG. 15A, when a wet etch process is used to remove the BLM layers 206 (which include, for example, a titanium tungsten BLM layer and a copper BLM layer on the titanium tungsten BLM layer) at process 620, this wet etch process may also essentially simultaneously remove the second metal cap layer 274 (which comprises a copper cap layer) on each additional metal feature 255b-c when the copper cap layer and the copper BLM layer have the same thickness).

Alternatively, when metal layers are deposited into the two-tier openings at process 612, the final metal layer deposited can be a copper cap layer that is relatively thick as compared to the previously deposited copper BLM layer, thereby forming the first copper cap layer 264 on each under-bump pad 255a and the second copper cap layer 274 on each additional metal feature 255b-c. For example, the copper cap layers 264, 274 can be deposited so that they are each thicker than any previously deposited copper BLM layer (e.g., 1.5 times thicker, 2 times thicker, etc.). Then, as illustrated in FIG. 15B, the wet etch process used to remove the BLM layers 206 (which include, for example, a titanium tungsten BLM layer and a copper BLM layer on the titanium tungsten BLM layer) at process 620 may be timed such that it stops once the BLM layers are removed and, thereby such that the thickness of the second metal cap layer 274 (which comprises a copper cap layer) on each additional metal feature 255b-c is simply reduced as compared to the first metal cap layer 264 on each under-bump pad 255a. Thus, in the resulting structure the second copper cap layer 274 will remain on each additional metal feature 255b-c, but will be relatively thin as compared to the first copper cap layer 264 on each under-bump pad 255a.

Figure 16A:
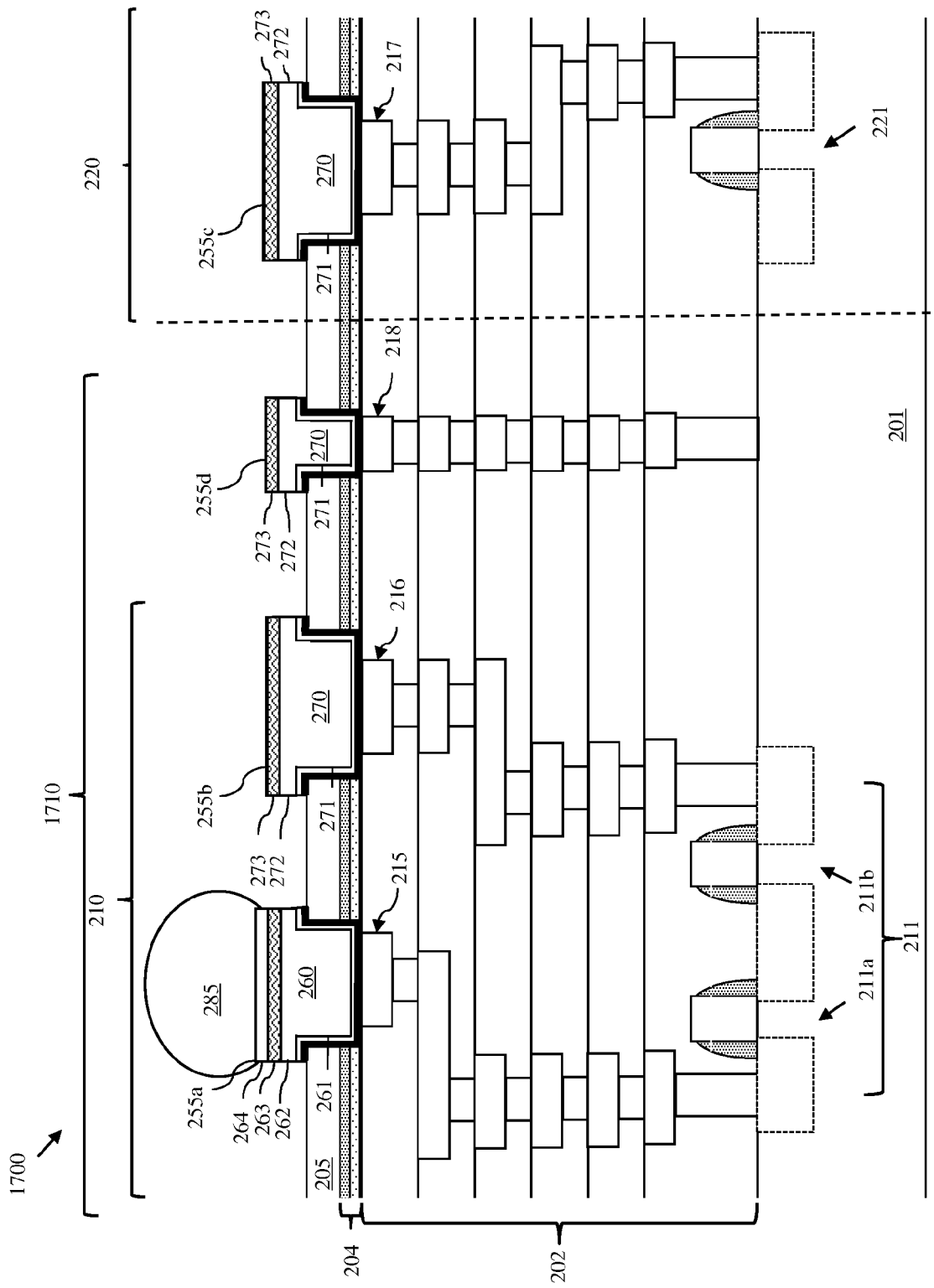
FIG. 16A is a cross-section view diagram showing a portion of a completed semiconductor wafer structure formed according to the flow diagram of FIG. 6.
Figure 16B:
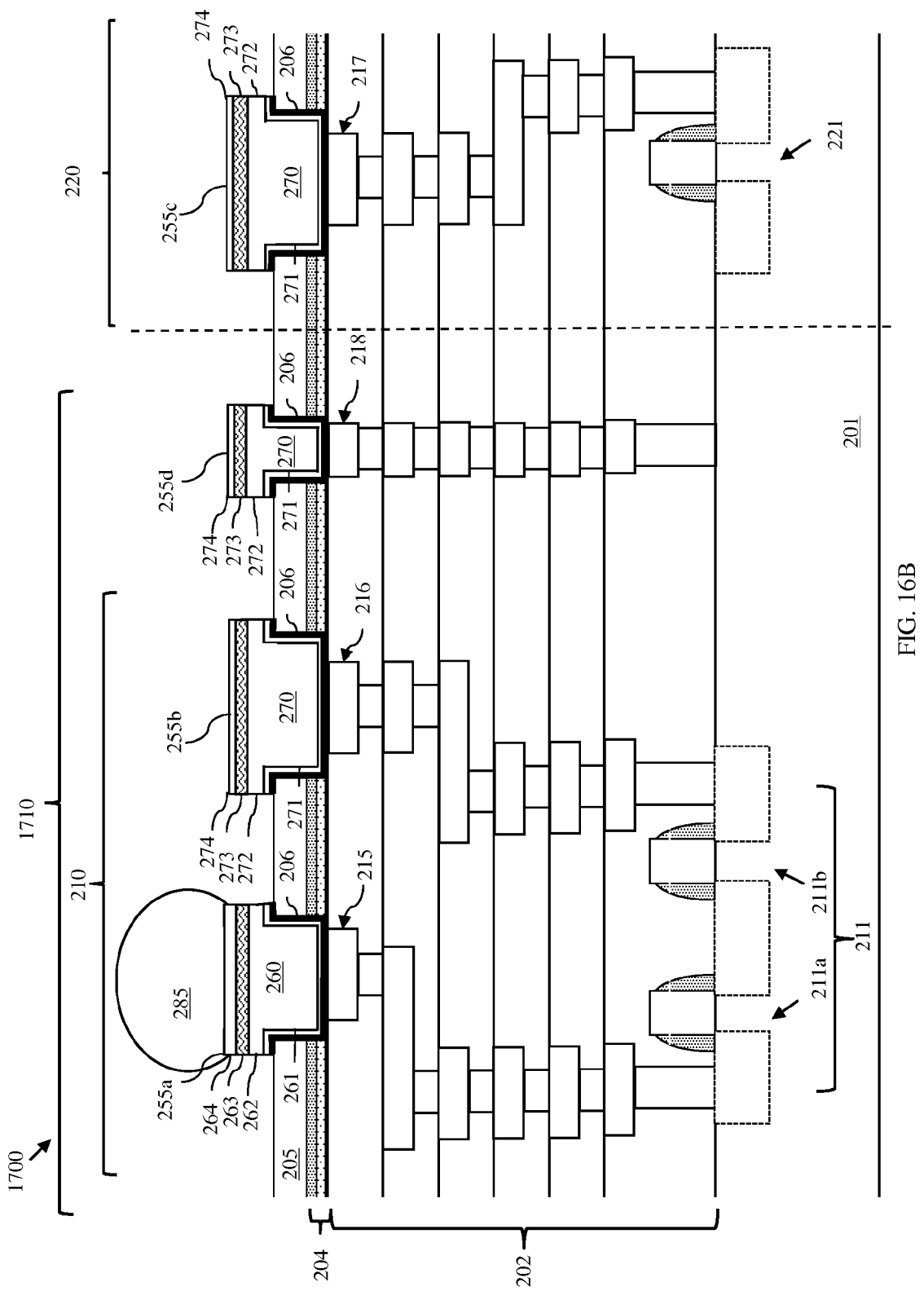
FIG. 16B is an alternative cross-section view diagram showing a portion of a completed semiconductor wafer structure formed according to the flow diagram of FIG. 6.
Figure 17:
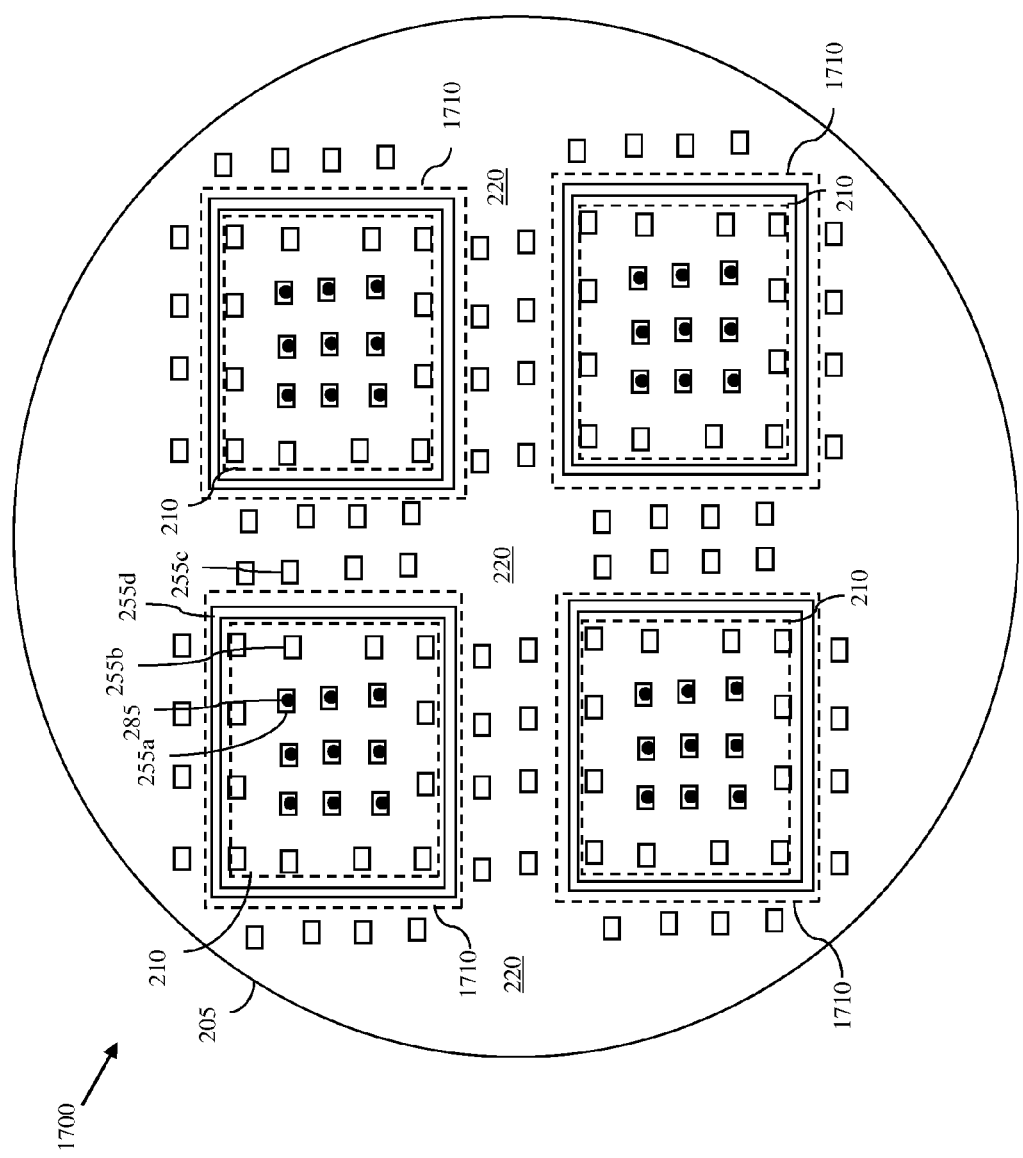
FIG. 17 is top view diagram showing a completed semiconductor wafer structure formed according to the flow diagram of FIG. 6.

Once the exposed portions of the BLM layers 206 are removed from the top surface of the passivation layer 205, a solder reflow process can be performed to complete formation of the solder bump(s) 285 on the under-bump pad(s) 255a and, thereby completing the FBEOL processing to complete the semiconductor wafer structure 1700 and the multiple integrated circuit chips 1710 on that semiconductor wafer structure 1700 (622, see the top view diagram of FIG. 17 showing the completed semiconductor wafer structure and the cross-section view diagram of FIG. 16A showing a portion of the completed semiconductor wafer structure or the alternative cross-section view diagram of FIG. 16B showing a portion of the completed semiconductor wafer structure).

Figure 18:
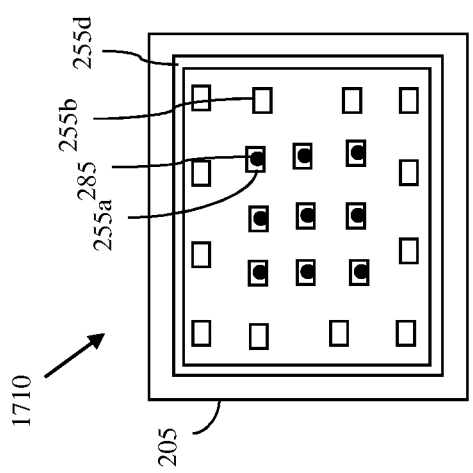
FIG. 18 is a top view diagram showing a completed integrated circuit chip following dicing of the completed semiconductor wafer structure of FIG. 17 at process 110 of FIG. 1.
Figure 19A:
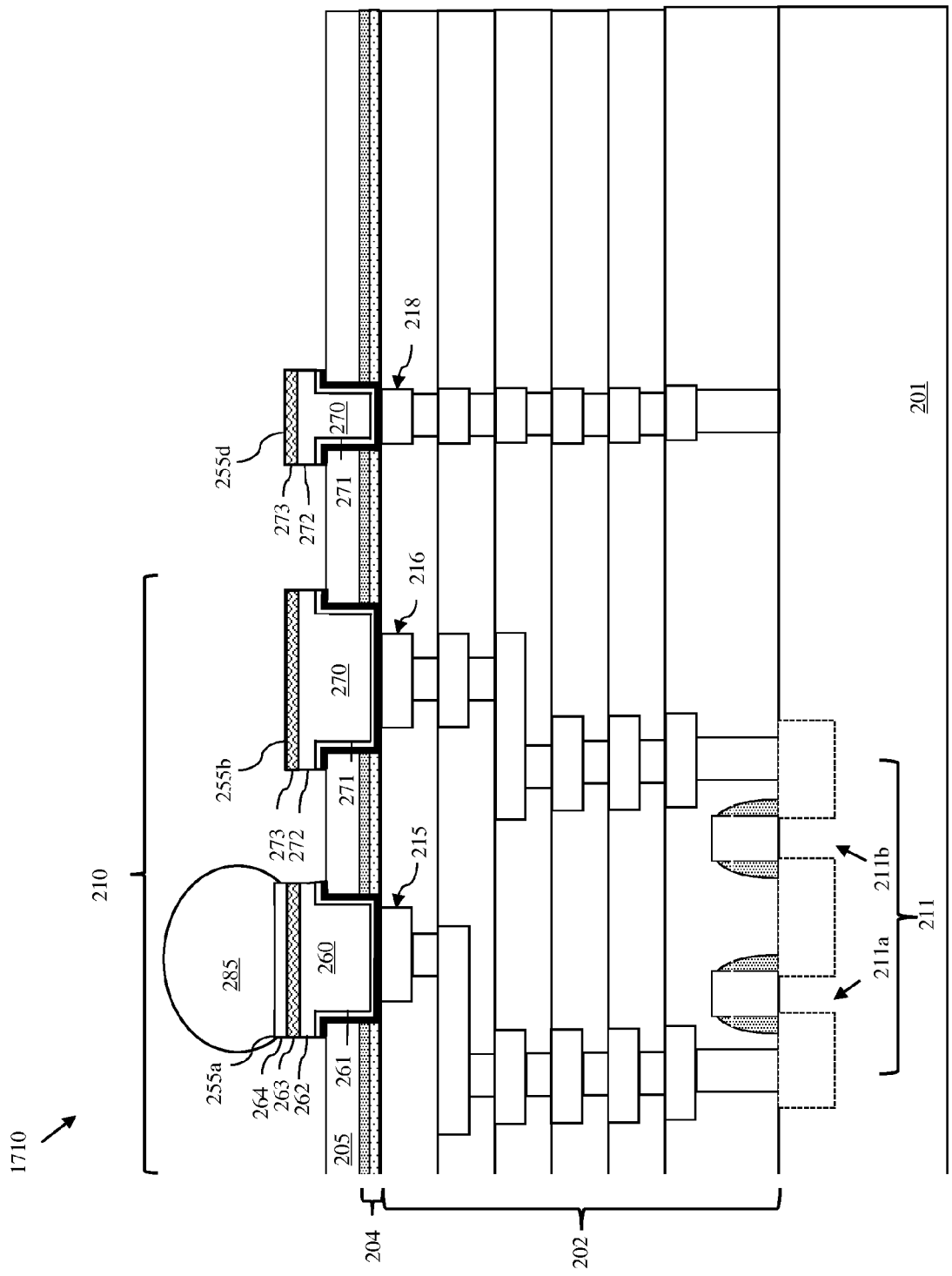
FIG. 19A is a cross-section view diagram showing a portion of the completed integrated circuit chip structure.
Figure 19B:
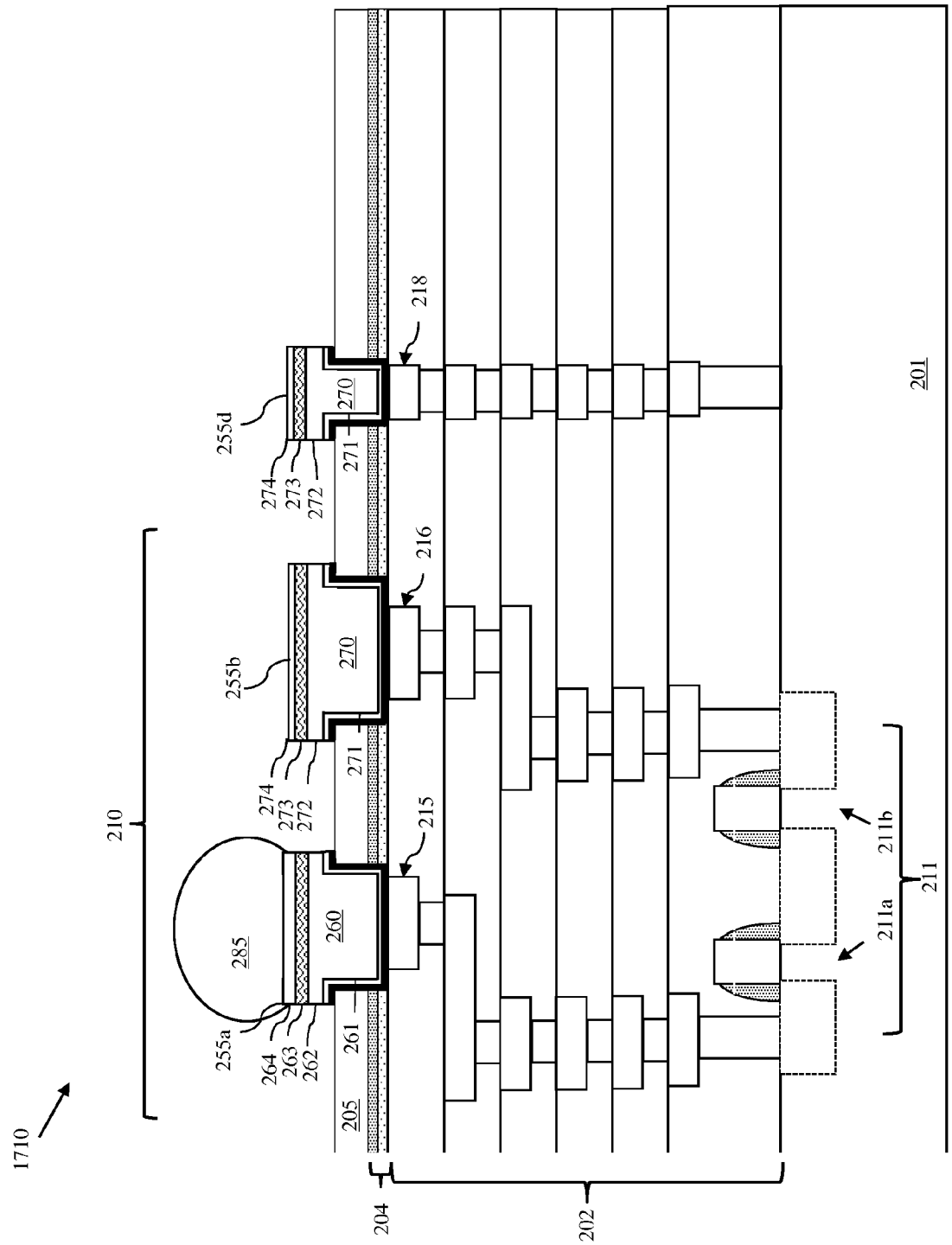
FIG. 19B is an alternative cross-section view diagram showing a portion of the completed integrated circuit chip structure.

Referring again to the flow diagram of FIG. 1, after the semiconductor wafer structure 1700 is completed at process 106, wafer-level testing of the integrated circuit chips 1710 can be performed (e.g., by using any previously formed probe pads 255c to electrically access test structures in the kerf regions 220 of the semiconductor layer 201, see FIG. 16A or, alternatively, FIG. 16B) (108). Then, the completed semiconductor wafer structure 1700 can be diced through the kerf regions 220 to form discrete integrated circuit chips 1710 (110, see the top view diagram of FIG. 18 showing a completed integrated circuit chip structure and the cross-section view diagram of FIG. 19A showing a portion of a completed integrated circuit chip structure or the alternative cross-section view diagram of FIG. 19B showing a portion of a completed integrated circuit chip structure).

Also disclosed herein are semiconductor structures, which can be formed using the above-described method. Specifically, disclosed herein is a completed semiconductor wafer structure 1700 following far back end of the line (FBEOL) metallization, as illustrated in the top view diagram of FIG. 17 and the cross-section view diagrams of FIG. 16A or 16B. Also disclosed herein is an integrated circuit chip structure 1710 formed as a result of dicing such a semiconductor wafer structure 1700, as illustrated in the top view diagram of FIG. 18 and the cross-section view diagrams of FIG. 19A or 19B).

More particularly, referring to FIGS. 16A, 16B and 17 in combination, the semiconductor wafer structure 1700 can comprise a semiconductor layer 201. This semiconductor layer 201 can comprise, for example, a single crystalline semiconductor layer (e.g., a single crystalline silicon layer) of a silicon-on-insulator (SOI) wafer or, alternatively, can comprise a bulk semiconductor substrate (e.g., bulk silicon substrate).

The semiconductor wafer structure 1700 can further comprise active regions 210 for integrated circuit chips 1710 and kerf regions 220 adjacent to the active regions 210. It should further be noted that, for illustration purposes, only four active regions 210 for four integrated circuit chips are shown in FIG. 17; however, those skilled in the art will recognize that this number will vary as a function of the integrated circuit chip size, the wafer size, the reticle layout, etc. Each active region 210 on the semiconductor layer 201 can comprise a plurality of devices 211 for an integrated circuit chip (e.g., see devices 211a and 211b) and the adjacent kerf regions 220 can comprise one or more test structures 221 for performing wafer-level testing of the integrated circuit chip. For purposes of illustration, the devices 211 in the active regions 210 and the test structures 221 in the kerf regions 220 are all shown as being conventional planar field effect transistors. However, it should be understood that the devices 211 can comprise any number of suitable integrated circuit devices (e.g., planar field effect transistors, non-planar field effect transistors, bipolar transistors, capacitors, diodes, etc.), according to the design of the integrated circuit chip. Similarly, the test structures 221 can comprise any number of suitable test devices (e.g., planar field effect transistors, non-planar field effect transistors, bipolar transistors, capacitors, diodes, etc.) or parametric measurement macros suitable for wafer-level testing of the integrated circuit chips, as designed.

The semiconductor wafer structure 1700 can further comprise a stack 202 of interlayer dielectrics above the semiconductor layer 201. The stack 202 of interlayer dielectrics can comprise multiple layers of any of the following dielectric materials alone and/or in combination: silicon dioxide (SiO$_2$), a silicon nitride (SiN), borophosphosilicate glass (BPSG), etc.

The semiconductor wafer structure 1700 can further comprise metal structures 215-218 within the stack 202 of interlayer dielectrics. The metal structures can comprise metal interconnects 215-216. Each of these metal interconnects 215-216 can comprise, for example, a combination of metal wires and/or vias that extend from a device (e.g., device 211a or device 211b) in an active region 210 of the semiconductor layer 201 to the top surface 203 of the stack 202. The metal structure can also comprise additional metal interconnect(s) 217. Each of these additional metal interconnect(s) 217 can comprise, for example, an additional combination of metal wires and vias that extend from a test structure 221 in a kerf region 220 of the semiconductor layer 201 to the top surface 203 of the stack 202. Additionally or alternatively, the metal structures can comprise main section(s) 218 of crackstop structures. As mentioned above, a crackstop structure is designed to inhibit damage during subsequent semiconductor wafer dicing and integrated circuit chip packaging. Each main section 218 of a crackstop structure can comprise, for example, a stack of metal wires and/or vias, which extends essentially vertically from the semiconductor layer 201 to the top surface 203 of the stack 202 and which laterally surrounds a given active region 210 and, thereby physically separates that given active region 210 from the adjacent kerf regions 220 (e.g., as illustrated in U.S. Pat. No. 6,022,791 and incorporated herein by reference above).

Optionally, the semiconductor wafer structure 1700 can further comprise one or more additional dielectric layers 204 on the top surface 203 of the stack 202 of interlayer dielectrics over exposed surfaces of the metal structures 215-218 and a passivation layer 205 on any additional dielectric layers 204. The additional dielectric layer(s) 204 can comprise, for example, a silicon oxide layer and a silicon nitride layer on the silicon oxide layer. The passivation layer 205 can comprise, for example, a photosensitive polyimide (PSPI) layer on the silicon nitride layer.

The semiconductor wafer structure 1700 can further comprise openings that extend vertically through the passivation layer 205 and any additional dielectric layers to the metal structures 215-218 below. These openings as well as the top surface of the passivation layer 205 at the edge of the openings can be lined with one or more ball limiting metallurgy (BLM) layers 206. The BLM layers 206 can comprise, for example, an adhesion BLM layer and a solder wetting BLM layer on the adhesion BLM layer. The adhesion BLM layer can comprise, for example, a titanium-tungsten BLM layer, a chromium BLM layer, a titanium BLM layer or any other suitable BLM layer selected to enhance adhesion. This adhesion BLM layer can be relatively thin (e.g., 0.01 to 0.25 microns). The solder wetting BLM layer can comprise, for example, a copper BLM layer on the adhesion BLM layer. This solder wetting BLM layer can be relatively thick as compared to the adhesion BLM layer (e.g., 0.1 to 2.0 microns).

The semiconductor wafer structure 1700 can further comprise one or more under-bump pad(s) 255a and one or more additional metal feature(s) 255b-d, which are different from the under-bump pad(s), on the BLM layers 206 within the above-described openings.

Each under-bump pad 255a can be aligned above and electrically connected (e.g., through BLM layers 206) to a metal interconnect (e.g., see metal interconnect 215) at the top surface 203 of the stack 202 of interlayer dielectrics above the active region 210 and electrically connected to a device (e.g., see device 211a) in that active region 210. Each under-bump pad 255a can comprise a first copper layer 260 (also referred to herein as a first copper plug) and two first metal cap layers 263-264 stacked on the first copper layer 260. The first copper layer 260 can have a first lower portion 261 that fills a BLM lined opening that extends vertically through the passivation layer 205 and any additional dielectric layers 204 to the top surface 203 of the stack 202 of interlayer dielectrics. Thus, the first copper layer 260 is electrically connected to the metal interconnect 215. The first copper layer 260 can further have a first upper portion 262 that is above the first lower portion 261. The first upper portion 262 can extend vertically above the top surface of the passivation layer 205 and can be wider than the first lower portion 261 such that the first copper layer 260 is essentially T-shaped. It should be noted that the height of the first lower portion 261 of the first copper layer 260 can be, for example, 3.0-10.0 microns, and the overall height of the first copper layer 260 can be, for example, 4.0 to 20.0 microns or greater. The two first metal cap layers 263-264 can comprise, for example, a first nickel cap layer 263 with a thickness of 0.5 to 2.0 microns on and immediately adjacent to the first copper layer 260 and a first copper cap layer 264 with a thickness of 0.5 to 2.0 microns on the first nickel cap layer 263. A solder bump 285 can be positioned on the first copper cap layer 264 of each under-bump pad 255a. The solder bump 285 can comprise, for example, tin, tin silver, copper sliver, bismuth, indium, zinc, antimony or any other suitable alloys thereof or any other suitable solder material having a reflow temperature that is lower than the melting temperature of the two first metal cap layers 263-264.

The additional metal feature(s) can comprise, for example, any of the following: (1) wirebond pad(s) 255b, each of which is aligned above and electrically connected to another metal interconnect (e.g., see metal interconnect 216) at the top surface 203 of the stack 202 of interlayer dielectrics above the active region 210 and each of which is electrically connected to another device (e.g., see device 211b) in that active region 210, so that the wirebond pad(s) 255b can provide electrical access to the device(s) 211b through the metal interconnect(s) 216; (2) final vertical section(s) 255d of crackstop structures, each of which is aligned above a main section 218 of a crackstop structure; and (3) probe pad(s) 255c, each of which is aligned above and electrically connected to an additional metal interconnect (e.g., see additional metal interconnect 217) located at the top surface 203 of the stack 202 of interlayer dielectrics above a kerf region 220 in the semiconductor layer 201 and each of which is electrically connected to a test structure 221 in that kerf region 220, so that the probe pad(s) 255c can provide electrical access to the test structure(s) 221 through the additional metal interconnect(s) 217.

In any case, each additional metal feature (e.g., 255b, 255c and/or 255d) can comprise a second copper layer 270 (also referred to herein as a second copper plug) and at least one second metal cap layer (see detailed discussion below) on the second copper layer 270. The second copper layer 270 can have a second lower portion 271 that fills a BLM lined opening that extends vertically through the passivation layer 205 and any additional dielectric layers 204 to the top surface 203 of the stack 202 of interlayer dielectrics. Thus, the second copper layer 270 is connected to the metal structure below (e.g., to metal interconnect 216 in the case of a wirebond pad 255b, to and additional metal interconnect 217 in the case of a probe pad 255c or to the main section 218 of a crackstop structure in the case of a final vertical section 255d of the crackstop structure). The second copper layer 270 can further comprise a second upper portion above the second lower portion 271. Optionally, the second upper portion 272 can extend vertically above the top surface of the passivation layer 205 and can be wider than the second lower portion 271 such that the second copper layer 270 is essentially T-shaped. The height of the second lower portion 271 of the second copper layer 270 can be the same as the height of the first lower portion 261 of the first copper layer 260, for example, 3.0-10.0 microns, and the overall height of the second copper layer 260 can be the same as the overall height of the first copper layer 260, for example, 4.0 to 20.0 microns or greater. The at least one second metal cap layer can comprise, for example, a single second nickel cap layer 273 with a thickness of 0.5 to 2.0 microns on and immediately adjacent to the second copper layer 270, as shown in FIG. 16A. Alternatively, a second nickel cap layer 273 with a thickness of 0.5 to 2.0 microns can be on and immediately adjacent to the second copper layer 270 and a second copper cap layer 274 can be on the second nickel cap layer 273, as shown in FIG. 16B. In this case, due to processing steps used as discussed in detail above with regard to the method embodiment, the second copper cap layer 274 of each additional metal feature (e.g., 255b, 255c and/or 255d) will be relatively thin as compared to the first copper cap layer 264 of each under-bump metal pad 255a.

As mention above, such a semiconductor wafer structure 1700 can be diced through the kerf regions 220 to form discrete integrated circuit chips 1710. Thus, referring to FIGS. 19A, 19B and 18 in combination, also disclosed herein is an integrated circuit chip structure 1710. This integrated circuit chip structure 1710 can comprise a semiconductor layer 201 and the semiconductor layer 201 can comprise an active region 210, which comprises one or more devices 211a-b.

The integrated circuit chip structure 1710 can further comprise a stack 202 of interlayer dielectrics above the semiconductor layer 201 and metal structures within the stack 202 of interlayer dielectrics. The metal structures can comprise metal interconnects 215-216 that extend from devices 211a-b in the active region 210 of the semiconductor layer 201 to the top surface 203 of the stack 202 of interlayer dielectrics. Optionally, the metal structures can comprise a main section 218 of a crackstop structure, which extends essentially vertically from the semiconductor layer 201 to the top surface 203 of the stack 202 of interlayer dielectrics and which laterally surrounds the active region 210.

Optionally, the integrated circuit chip structure 1710 can further comprise one or more additional dielectric layers 204 on the top surface 203 of the stack 202 of interlayer dielectrics over exposed surfaces of the metal structures 215-216 and 218 and a passivation layer 205 on any additional dielectric layers 204.

The integrated circuit chip structure 1710 can further comprise openings that extend vertically through the passivation layer 205 and any additional dielectric layers 204 to metal structures 215 and metal structures 216 and 218 below. These openings as well as the top surface of the passivation layer 205 at the edge of the openings can be lined with one or more ball limiting metallurgy (BLM) layers 206.

The integrated circuit chip structure 1710 can further comprise one or more under-bump pad(s) 255a and one or more additional metal feature(s) 255b and/or 255dd, which are different from the under-bump pad(s), on the BLM layers 206.

As discussed in detail above with regard to the semiconductor wafer structure 1700, each under-bump pad 255a can be aligned above and electrically connected (e.g., through BLM layers 206) to a metal interconnect (e.g., see metal interconnect 215). Each under-bump pad 255a can comprise a first copper layer 260 and two first metal cap layers 263-264 stacked on the first copper layer 260. The first copper layer 260 can have a first lower portion 261 and a first upper portion 262 that is above the first lower portion. Optionally, in the first copper layer 260, the first upper portion 262 can be wider than the first lower portion 261 such that the first copper layer 260 is essentially T-shaped. The two first metal cap layers 263-264 can comprise, for example, a first nickel cap layer 263 on and immediately adjacent to the first copper layer 260 and a first copper cap layer 264 on the first nickel cap layer 263. A solder bump 285 can be positioned on the first copper cap layer 264 of each under-bump pad 255a.

The additional metal feature(s) can comprise, for example, any of the following: (1) wirebond pad(s) 255b that provide electrical access to the device(s) 211b through the metal interconnect(s) 216; and/or (2) a final vertical section 255d of a crackstop structure aligned above a main section 218 of the crackstop structure. It should be noted that any probe pads that were aligned above and electrically connected to test structures in the kerf regions of the semiconductor wafer structure would be destroyed during semiconductor wafer structure dicing to form the integrated circuit chips and, thus, the additional metal features of the disclosed integrated circuit chip structure 1710 do not include such probe pads.

In any case, each additional metal feature (e.g., 255b and/or 255d) can comprise a second copper layer 270 and at least one second metal cap layer (see detailed discussion below) on the second copper layer 270. The second copper layer 270 can have a second lower portion 271 and a second upper portion above the second lower portion 272. Optionally, in the second copper layer 270, the second upper portion 272 can be wider than the second lower portion 271 such that the second copper layer 270 is essentially T-shaped. The at least one second metal cap layer can comprise, for example, a single second nickel cap layer 273 on and immediately adjacent to the second copper layer 270, as shown in FIG. 19A. Alternatively, a second nickel cap layer 273 can be on and immediately adjacent to the second copper layer 270 and a second copper cap layer 274 can be on the second nickel cap layer 273, as shown in FIG. 19B. In this case, due to processing steps used as discussed in detail above with regard to the method embodiment, the second copper cap layer 274 of each additional metal feature (e.g., 255b and/or 255d) will be relatively thin as compared to the first copper cap layer 264 of each under-bump metal pad 255a.

It should be understood that the terminology used herein is for the purpose of describing structures and methods only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The above-description has been presented for purposes of illustration, but is not intended to be exhaustive or limiting. Many modifications and variations will be apparent to those of ordinary skill in the art without departing from the scope and spirit of the disclosed structures and methods.

Therefore, disclosed above is an improved method for far back end of the line (FBEOL) metallization during semiconductor wafer processing. Specifically, after front end of the line (FEOL), middle of the line (MOL) and initial back end of the line (BEOL) processing of a semiconductor wafer, a passivation layer can be formed and patterned with first openings aligned above and extending vertically to metal structures below (e.g., to metal interconnects or main sections of crackstop structures below). A mask layer can be formed on the passivation layer and patterned with second openings aligned above the first openings, thereby forming two-tier openings extending vertically through the mask layer and passivation layer to the structures below. A first electrodeposition process can be performed in order to form, in the two-tier openings, both under-bump pad(s) and additional metal feature(s), which are different from the under-bump pad(s) (e.g., a wire-bond pad, a final vertical section of a crackstop structure, and/or a probe pad). Each under-bump pad and additional metal feature can initially be formed so as to comprise copper with metal cap layers thereon. The mask layer can then be removed and an additional mask layer can be formed and patterned with third opening(s) exposing only the under-bump pad(s). Then, a second electrodeposition process can be performed in order to deposit solder material on the under-bump pad(s). During subsequent semiconductor wafer and integrated circuit chip processing, the metal cap layers can protect the additional metal feature(s) from etchback, oxidation, etc. Also disclosed above are semiconductor structures (e.g., a semiconductor wafer structure and an integrated circuit chip structure), which can be formed using the above-described method.

What is claimed is:

1. A method comprising:
    forming, above a semiconductor layer, a stack of interlayer dielectrics and metal structures extending through said stack of interlayer dielectrics;
    forming a passivation layer above a top surface of said stack of interlayer dielectrics;
    forming first openings in a passivation layer, said first openings exposing tops of said metal structures, respectively;
    forming a mask layer above said passivation layer;
    forming second openings in said mask layer aligned above said first openings so as to form two-tier openings extending vertically through said mask layer and said passivation layer, said two-tier openings being aligned above said metal structures;
    depositing metal layers into said two-tier openings so as to essentially simultaneously form:
        an under-bump pad in a first two-tier opening on one of said metal structures, said under-bump pad comprising: a first copper layer comprising a first lower portion extending vertically through said passivation layer and a first upper portion above said first lower portion; and two first metal cap layers stacked on said first copper layer; and
        an additional metal feature in a second two-tier opening on another of said metal structures, said additional metal feature comprising: a second copper layer comprising a second lower portion extending vertically through said passivation layer and a second upper portion above said second lower portion; and two second metal cap layers stacked on said second copper layer;
    removing said mask layer;
    forming an additional mask layer on said passivation layer over said under-bump pad and said additional metal feature;
    forming a third opening extending vertically through said additional mask layer to expose said under-bump pad;
    depositing solder material in said third opening on said under-bump pad immediately adjacent one of said two first metal cap layers, said additional mask layer preventing deposition of said solder material on said additional metal feature; and
    removing said additional mask layer.

2. The method of claim 1, said two first metal cap layers comprising a first nickel cap layer and a first copper cap layer on said first nickel cap layer and said two second metal cap layers comprising a second nickel cap layer and a second copper cap layer on said second nickel cap layer.

3. The method of claim 2, further comprising:
before said forming of said mask layer, depositing ball limiting metallurgy layers on said passivation layer and lining said first openings; and
after said removing of said additional mask layer, performing an etch process to remove exposed portions of said ball limiting metallurgy layers.

4. The method of claim 3,
said ball limiting metallurgy layers comprising a titanium tungsten ball limiting metallurgy layer and a copper ball limiting metallurgy layer on said titanium tungsten ball limiting metallurgy layer, and
said etch process being performed so as to simultaneously remove said second copper cap layer from said additional metal feature, leaving said second nickel cap layer intact.

5. The method of claim 3,
said ball limiting metallurgy layers comprising a titanium tungsten ball limiting metallurgy layer and a copper ball limiting metallurgy layer on said titanium tungsten ball limiting metallurgy layer, and
said second copper cap layer of said additional metal feature being relatively thick as compared to said copper ball limiting metallurgy layer so that, following said etch process to remove said exposed portions of said at least one ball limiting metallurgy layer, said second copper cap layer remains on said second nickel cap layer and is thinner than said first copper cap layer.

6. The method of claim 1,
said semiconductor layer having active regions for integrated circuit chips and kerf regions adjacent to said active regions,
said metal structures comprising:
    an interconnect at said top surface of said stack of interlayer dielectrics and electrically connected to a device in an active region of said semiconductor layer; and,
    a main section of a crackstop structure, said main section of said crackstop structure extending from said top surface of said stack of interlayer dielectrics to said semiconductor layer and laterally surrounding said active region,
said first two-tier opening being formed so as to be aligned above said interconnect,
said second two-tier opening being formed so as to be aligned above said main section of said crackstop structure, and
said additional metal feature being formed as a final vertical section of said crackstop structure.

7. The method of claim 1,
said semiconductor layer having active regions for integrated circuit chips and kerf regions adjacent to said active regions,
said metal structures comprising:
    a first interconnect at said top surface of said stack of interlayer dielectrics and electrically connected to a first device in an active region of said semiconductor layer; and
    a second interconnect at said top surface of said stack of interlayer dielectrics and electrically connected to a second device in said active region of said semiconductor layer,
said first two-tier opening being formed so as to be aligned above said first interconnect,
said second two-tier opening being formed so as to be aligned above said second interconnect, and
said additional metal feature being formed as wirebond pad that provides electrical access through said second interconnect to said second device.

8. The method of claim 1,
said semiconductor layer having active regions for integrated circuit chips and kerf regions adjacent to said active regions,
said metal structures comprising:
    an interconnect at said top surface of said stack of interlayer dielectrics and electrically connected to a device in an active region of said semiconductor layer; and
    an additional interconnect at said top surface of said stack of interlayer dielectrics and electrically connected to a test structure in a kerf region of said semiconductor layer, said first two-tier opening being formed so as to be aligned above said interconnect,
said second two-tier opening being formed so as to be aligned above said additional interconnect, and
said additional metal feature being formed as probe pad that provides electrical access through said additional interconnect to said test structure.

9. A method comprising:
forming, on a semiconductor layer, active regions for integrated circuit chips and kerf regions adjacent to said active regions,
forming, above said active regions and said kerf regions, a stack of interlayer dielectrics and metal structures extending through said stack of interlayer dielectrics, said metal structures comprising:
    an interconnect at a top surface of said stack of interlayer dielectrics and electrically connected to a device in an active region; and,
    an additional interconnect at said top surface of said stack, electrically isolated from said interconnect and electrically connected to a test structure in said kerf region;
forming a passivation layer above said top surface of said stack of interlayer dielectrics;
forming first openings in a passivation layer, said first openings exposing tops of said metal structures, respectively;
forming a mask layer above said passivation layer;
forming second openings in said mask layer aligned above said first openings so as to form two-tier openings extending vertically through said mask layer and said passivation layer, said two-tier openings being aligned above said metal structures;
depositing metal layers into said two-tier openings so as to essentially simultaneously form:
    an under-bump pad in a first two-tier opening on said interconnect, said under-bump pad comprising: a first copper layer comprising a first lower portion extending vertically through said passivation layer and a first upper portion above said first lower portion; and two first metal cap layers stacked on said first copper layer; and
    a probe pad in a second two-tier opening on said additional interconnect, said probe pad being electrically isolated from said under-bump pad and providing electrical access through said additional interconnect to said test structure and said probe pad comprising: a second copper layer comprising a second lower portion extending vertically through said passivation layer and a second upper portion above said second lower portion; and two second metal cap layers stacked on said second copper layer;

removing said mask layer;

forming an additional mask layer on said passivation layer over said under-bump pad and said probe pad;

forming a third opening extending vertically through said additional mask layer to expose said under-bump pad;

depositing solder material in said third opening on said under-bump pad immediately adjacent to one of said two first metal cap layers, said additional mask layer preventing deposition of said solder material on said probe pad; and removing said additional mask layer.

10. The method of claim 9, said two first metal cap layers comprising a first nickel cap layer and a first copper cap layer on said first nickel cap layer and said two second metal cap layers comprising a second nickel cap layer and a second copper cap layer on said second nickel cap layer.

11. The method of claim 10, further comprising:

before said forming of said mask layer, depositing ball limiting metallurgy layers on said passivation layer and lining said first openings; and after said removing of said additional mask layer, performing an etch process to remove exposed portions of said ball limiting metallurgy layers.

12. The method of claim 11, said ball limiting metallurgy layers comprising a titanium tungsten ball limiting metallurgy layer and a copper ball limiting metallurgy layer on said titanium tungsten ball limiting metallurgy layer, and said etch process being performed so as to simultaneously remove said second copper cap layer from said additional metal feature, leaving said second nickel cap layer intact.

13. The method of claim 11, said ball limiting metallurgy layers comprising a titanium tungsten ball limiting metallurgy layer and a copper ball limiting metallurgy layer on said titanium tungsten ball limiting metallurgy layer, and said second copper cap layer of said additional metal feature being relatively thick as compared to said copper ball limiting metallurgy layer so that, following said etch process to remove said exposed portions of said at least one ball limiting metallurgy layer, said second copper cap layer remains on said second nickel cap layer and is thinner than said first copper cap layer.

14. A method comprising:

forming, on a semiconductor layer, active regions for integrated circuit chips;

forming, above said active regions, a stack of interlayer dielectrics and metal structures extending through said stack of interlayer dielectrics, said metal structures comprising:

an interconnect at a top surface of said stack of interlayer dielectrics and electrically connected to a device in an active region; and a main section of a crackstop structure, said main section of said crackstop structure being electrically isolated from said interconnect, extending from said top surface of said stack of interlayer dielectrics to said semiconductor layer and laterally surrounding said active region;

forming a passivation layer above said top surface of said stack of interlayer dielectrics;

forming first openings in a passivation layer, said first openings exposing tops of said metal structures, respectively;

forming a mask layer above said passivation layer;

forming second openings in said mask layer aligned above said first openings so as to form two-tier openings extending vertically through said mask layer and said passivation layer, said two-tier openings being aligned above said metal structures;

depositing metal layers into said two-tier openings so as to essentially simultaneously form:

an under-bump pad in a first two-tier opening on said interconnect, said under-bump pad comprising: a first copper layer comprising a first lower portion extending vertically through said passivation layer and a first upper portion above said first lower portion; and two first metal cap layers stacked on said first copper layer; and a final vertical section of said crackstop structure in a second two-tier opening on said main section of said crackstop structure, said final vertical section of said crackstop structure being electrically isolated from said under-bump pad and comprising: a second copper layer comprising a second lower portion extending vertically through said passivation layer and a second upper portion above said second lower portion; and two second metal cap layers stacked on said second copper layer;

removing said mask layer;

forming an additional mask layer on said passivation layer over said under-bump pad and said final vertical section of said crackstop structure;

forming a third opening extending vertically through said additional mask layer to expose said under-bump pad;

depositing solder material in said third opening on said under-bump pad immediately adjacent to one of said two first metal cap layers, said additional mask layer preventing deposition of said solder material on said final vertical section of said crackstop structure; and removing said additional mask layer.

15. The method of claim 14, said two first metal cap layers comprising a first nickel cap layer and a first copper cap layer on said first nickel cap layer and said two second metal cap layers comprising a second nickel cap layer and a second copper cap layer on said second nickel cap layer.

16. The method of claim 15, further comprising:

before said forming of said mask layer, depositing ball limiting metallurgy layers on said passivation layer and lining said first openings; and after said removing of said additional mask layer, performing an etch process to remove exposed portions of said ball limiting metallurgy layers.

17. The method of claim 16, said ball limiting metallurgy layers comprising a titanium tungsten ball limiting metallurgy layer and a copper ball limiting metallurgy layer on said titanium tungsten ball limiting metallurgy layer, and said etch process being performed so as to simultaneously remove said second copper cap layer from said additional metal feature, leaving said second nickel cap layer intact.

18. The method of claim 16, said ball limiting metallurgy layers comprising a titanium tungsten ball limiting metallurgy layer and a copper ball limiting metallurgy layer on said titanium tungsten ball limiting metallurgy layer, and said second copper cap layer of said additional metal feature being relatively thick as compared to said copper ball limiting metallurgy layer so that, following said etch process to remove said exposed portions of said at least one ball limiting metallurgy layer, said second copper cap layer remains on said second nickel cap layer and is thinner than said first copper cap layer.

* * * * *